(12) United States Patent
Ching et al.

(10) Patent No.: US 12,527,064 B2
(45) Date of Patent: Jan. 13, 2026

(54) POWER REDUCTION IN FINFET STRUCTURES

(71) Applicant: Taiwan Semiconductor Manufacturing Co., Ltd., Hsinchu (TW)

(72) Inventors: Kuo-Cheng Ching, Zhubei (TW); Chih-Hao Wang, Zhubei (TW); Kuan-Lun Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/439,132

(22) Filed: Feb. 12, 2024

(65) Prior Publication Data
US 2024/0186184 A1    Jun. 6, 2024

Related U.S. Application Data

(60) Division of application No. 17/516,404, filed on Nov. 1, 2021, now Pat. No. 11,948,839, which is a
(Continued)

(51) Int. Cl.
| | |
|---|---|
| H01L 21/8234 | (2006.01) |
| H01L 23/535 | (2006.01) |
| H10D 30/01 | (2025.01) |
| H10D 62/10 | (2025.01) |
| H10D 62/13 | (2025.01) |

(Continued)

(52) U.S. Cl.
CPC ......... *H10D 84/013* (2025.01); *H01L 23/535* (2013.01); *H10D 30/0243* (2025.01); *H10D 62/116* (2025.01); *H10D 62/151* (2025.01); *H10D 62/292* (2025.01); *H10D 64/017* (2025.01); *H10D 84/0128* (2025.01); *H10D 84/0149* (2025.01); *H10D 84/0151* (2025.01); *H10D 84/0158* (2025.01);
(Continued)

(58) Field of Classification Search
None
See application file for complete search history.

(56) References Cited

U.S. PATENT DOCUMENTS

| | | |
|---|---|---|
| 7,015,116 B1 | 3/2006 | Lo et al. |
| 8,962,400 B2 | 2/2015 | Tsai et al. |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

*Primary Examiner* — Long Pham
(74) *Attorney, Agent, or Firm* — Sterne, Kessler, Goldstein & Fox P.L.L.C.

(57) ABSTRACT

The present disclosure describes a method to reduce power consumption in a fin structure. For example, the method includes forming a first and a second semiconductor fins on a substrate with different heights. The method also includes forming insulating fins between and adjacent to the first and the second semiconductor fins. Further, the method includes forming a first and second epitaxial stacks with different heights on each of the first and second semiconductor fins.

20 Claims, 30 Drawing Sheets

Related U.S. Application Data continuation of application No. 16/544,485, filed on Aug. 19, 2019, now Pat. No. 11,164,786, which is a continuation of application No. 15/718,740, filed on Sep. 28, 2017, now Pat. No. 10,403,545.

(51) Int. Cl.
| | |
|---|---|
| *H10D 62/17* | (2025.01) |
| *H10D 64/01* | (2025.01) |
| *H10D 84/01* | (2025.01) |
| *H10D 84/03* | (2025.01) |
| *H10D 84/83* | (2025.01) |
| H10D 62/822 | (2025.01) |
| H10D 62/832 | (2025.01) |

(52) U.S. Cl.
CPC ......... *H10D 84/038* (2025.01); *H10D 84/834* (2025.01); *H10D 62/822* (2025.01); *H10D 62/832* (2025.01)

(56) References Cited

U.S. PATENT DOCUMENTS

| | | | |
|---|---|---|---|
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,318,581 B1 | 4/2016 | Guo et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,799,570 B1 * | 10/2017 | Cheng | H01L 21/762 |
| 9,812,363 B1 | 11/2017 | Liao et al. | |
| 9,859,380 B2 | 1/2018 | Lee et al. | |
| 10,483,378 B2 * | 11/2019 | Ching | H10D 30/62 |
| 2019/0067445 A1* | 2/2019 | Ching | H10D 62/116 |
| 2019/0096765 A1 | 3/2019 | Ching et al. | |
| 2019/0371673 A1 | 12/2019 | Ching et al. | |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

\* cited by examiner

US 12,527,064 B2

POWER REDUCTION IN FINFET STRUCTURES

CROSS-REFERENCE TO RELATED APPLICATION

This application is a divisional of U.S. Non-Provisional patent application Ser. No. 17/516,404, titled "Power Reduction in FinFET Structures," filed on Nov. 1, 2021, which is a continuation of U.S. Non-Provisional patent application Ser. No. 16/544,485, titled "Power Reduction in FinFET Structures," filed on Aug. 19, 2019, which is a continuation of U.S. Non-Provisional patent application Ser. No. 15/718,740, titled "Power Reduction in FinFET Structures," filed on Sep. 28, 2017, all of which are incorporated herein by reference in their entireties.

BACKGROUND

Integrated circuits (ICs) utilized in mobile applications, such as mobile computing, smart phones, tablets, and smart gear, can have stringent power requirements. Power reduction in an IC can be realized, for example, by adopting fin field effect transistor (finFETs), by minimizing transistor leakage current, and by mitigating parasitic capacitances. Additionally, layout modifications can also be used to reduce power consumption in ICs.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
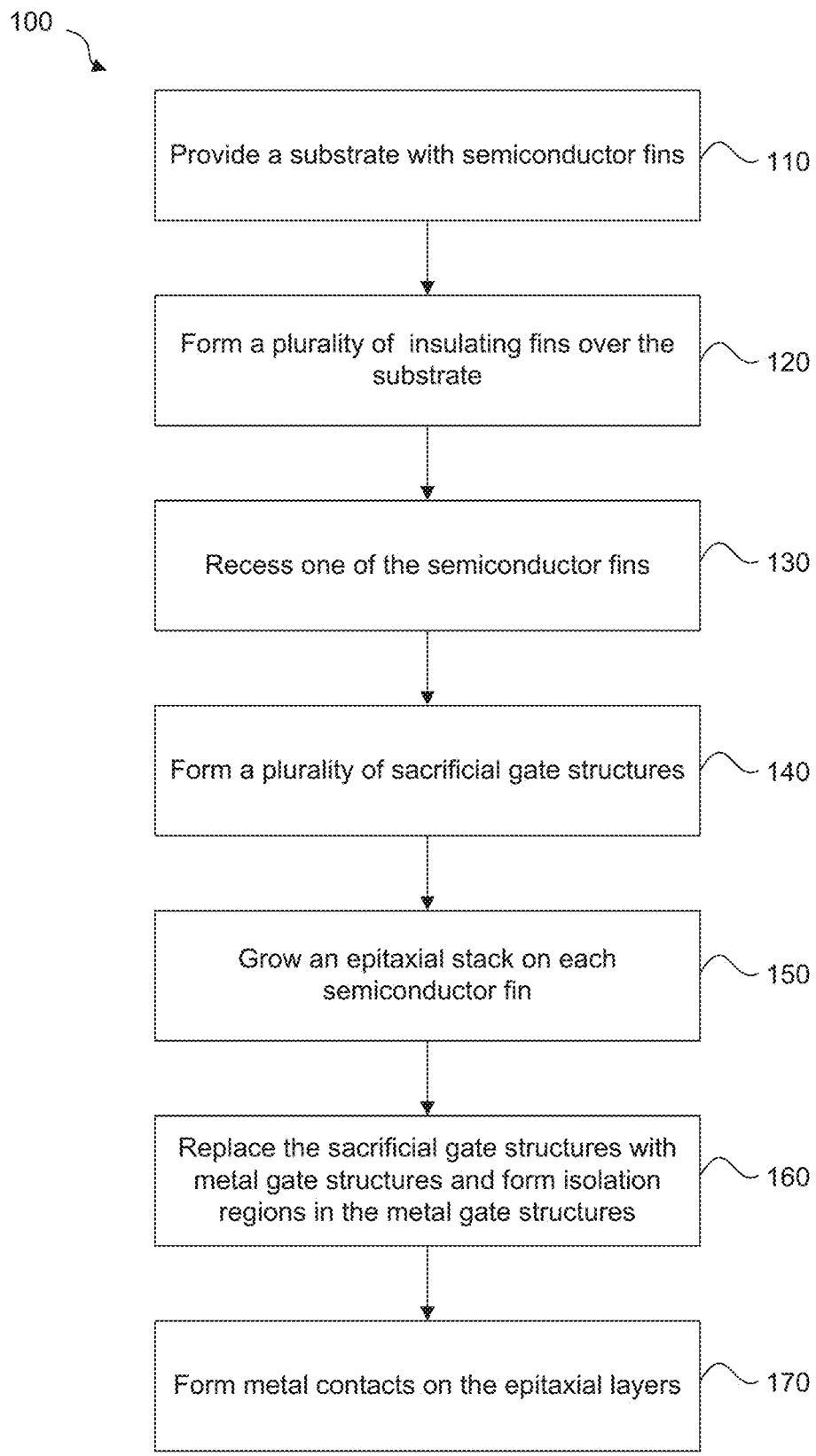
FIG. 1 is a flow diagram of a fabrication method of a single fin structure with a with a fin and a S/D height reduction in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

Integrated circuits (ICs) utilized in mobile applications, such as mobile computing, smart phones, tablets, and smart gear, can have stringent power requirements. Power reduction in an IC can be realized, for example, by adopting fin field effect transistor (finFETs), by minimizing transistor leakage current, and by mitigating parasitic capacitances. Additionally, layout modifications can also be used to reduce power consumption in an IC. For example, fin width reduction at predetermined locations may be implemented to reduce power consumption in a two-fin structure. However, such layout modification may not be possible for all fin structures; for example, in a single-fin structure that can be used to increase the transistor density in future semiconductor manufacturing generations (nodes).

The embodiments described herein are directed to a method that can reduce the power consumption of a single-fin finFET structures. For example, in some embodiments, the fin height and the source/drain (S/D) height of a single-fin finFET structure can be reduced to decrease parasitic capacitances between, for example, the S/D and the finFET gate structure. In some embodiments, the S/D height of the single-finFET structure can be reduced without a fin height reduction.

FIG. 1 is a flow chart of a fabrication method 100 according to some embodiments. Fabrication method 100 describes the formation of a single-fin structure with fin and S/D height reduction according to some embodiments. Other fabrication operations may be performed between the various operations of method 100 and may be omitted merely for clarity. This fabrication method is not limited to method 100 and other alternative methods can be possible.

Figure 2:
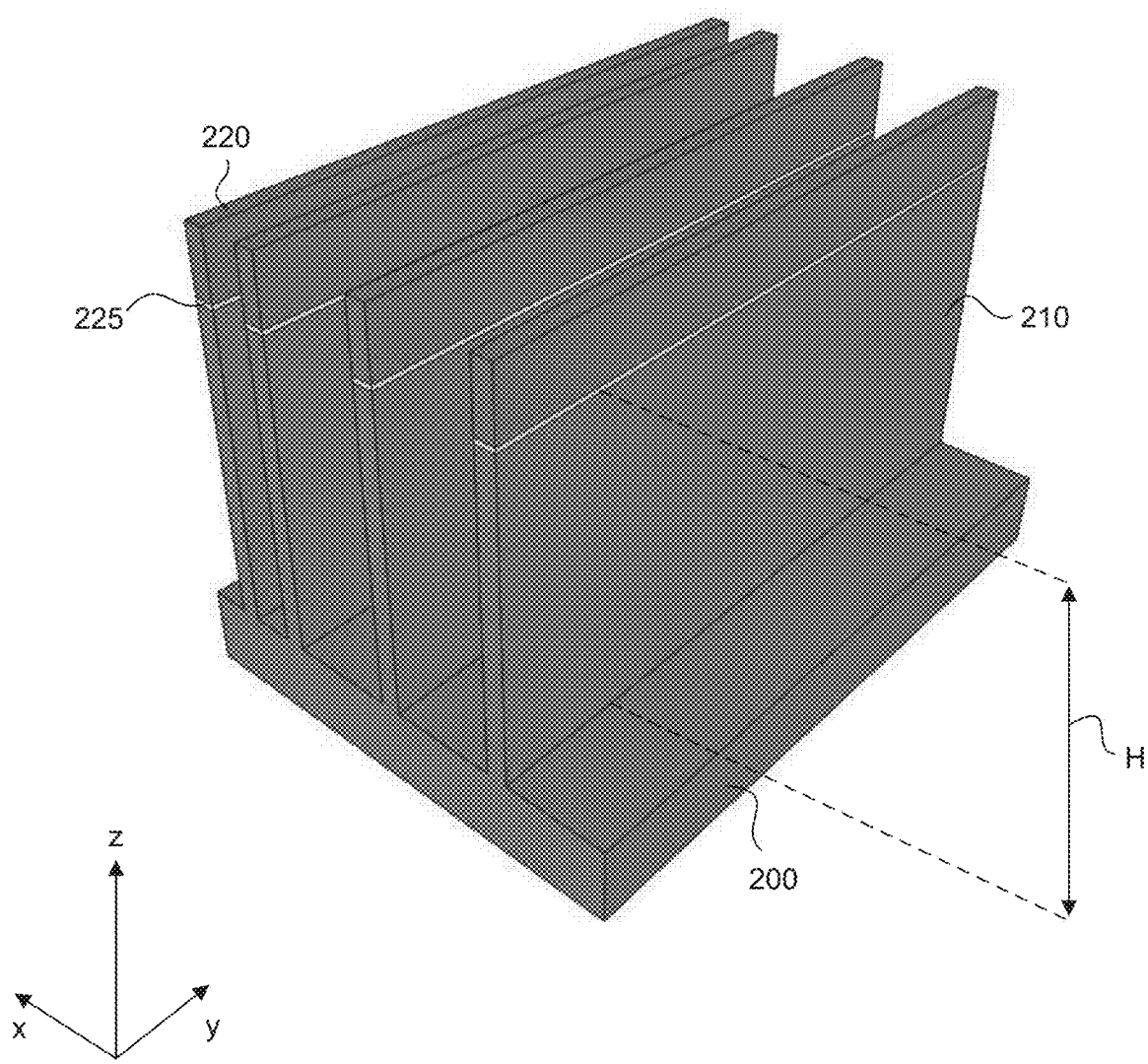
FIG. 2 is an isometric view of a substrate with fins formed thereon in accordance with some embodiments.

Method 100 begins with operation 110 where a substrate is provided with semiconductor fins thereon. For example, FIG. 2 is an isometric view of a substrate 200 with semiconductor fins 210 formed thereon. A hard mask layer 220 is deposited over semiconductor fins 210. In some embodiments, hard mask layer 220 can be, for example, silicon nitride (SiN) or silicon carbon nitride (SiCN), and can protect semiconductor fins 210 from subsequent etch operations. In some embodiments, hard mask layer 220 may include a bottom oxide layer 225. Oxide layer 225 can be, for example, silicon oxide. According to some embodiments, fins 210 can have a height H measured from the base of fins 210 (e.g., from the top of substrate 200) to the tip of fins 210 (e.g., below bottom oxide layer 225).

In some embodiments, substrate 200 can be a bulk semiconductor wafer or a semiconductor on insulator (SOI) wafer such as, for example, silicon on insulator. Further, substrate 200 can be made of silicon or another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

In some embodiments, fins 210 can be perpendicular to the substrate's surface, and can be made of the same material as substrate 200, or different. For example, fins 210 can be made of silicon or another elementary semiconductor such as, for example, (i) Ge; (ii) a compound semiconductor including silicon carbide, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof.

For example purposes, substrate 200 and semiconductor fins 210 in method 100 will be described in the context of silicon (e.g., single crystal). Based on the disclosure herein, other materials, as discussed above, can be used. These materials are within the spirit and scope of this disclosure.

Figure 3:
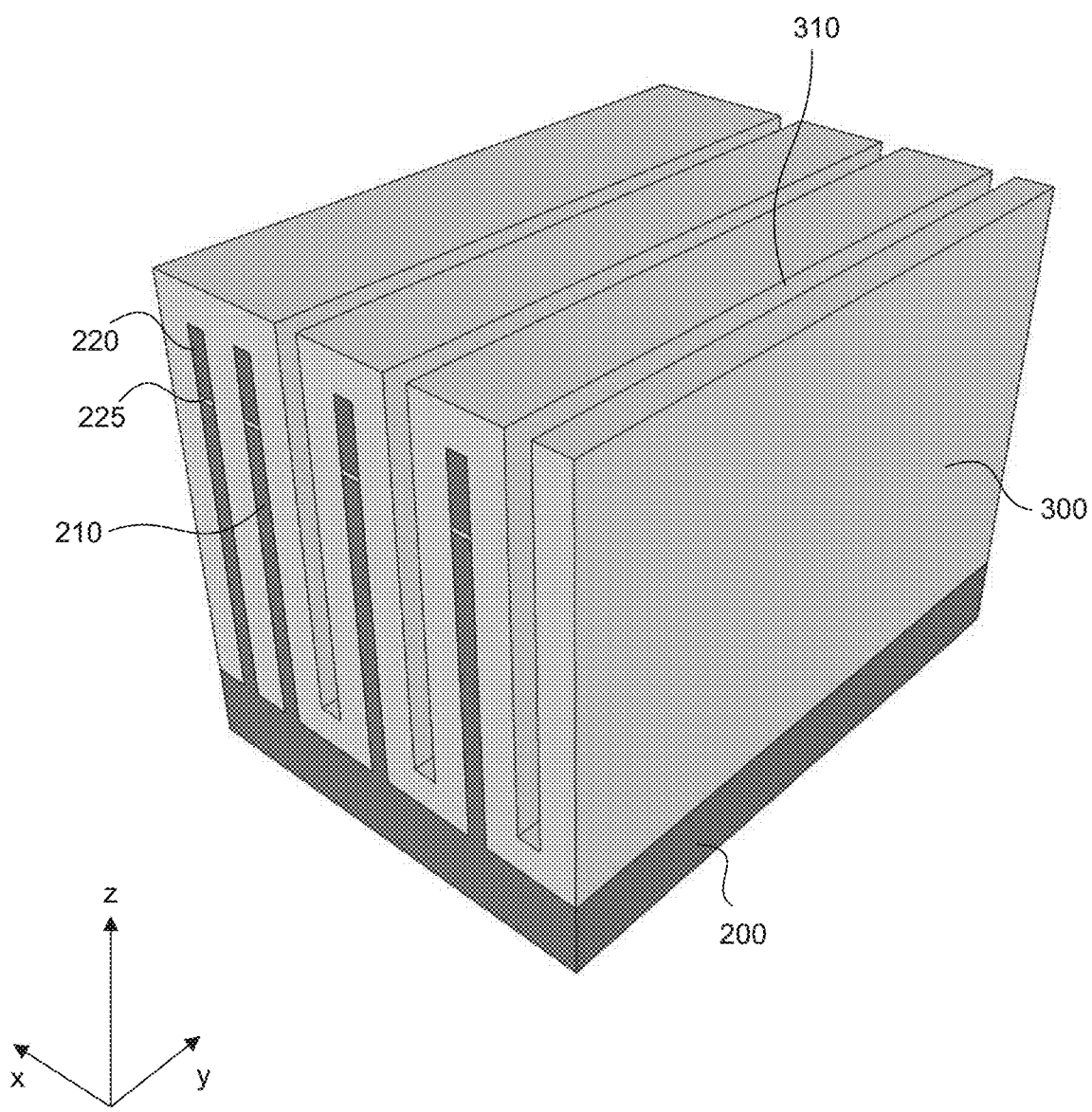
FIG. 3 is an isometric view of an oxide layer deposited and patterned over semiconductor fins in accordance with some embodiments.
Figure 4:
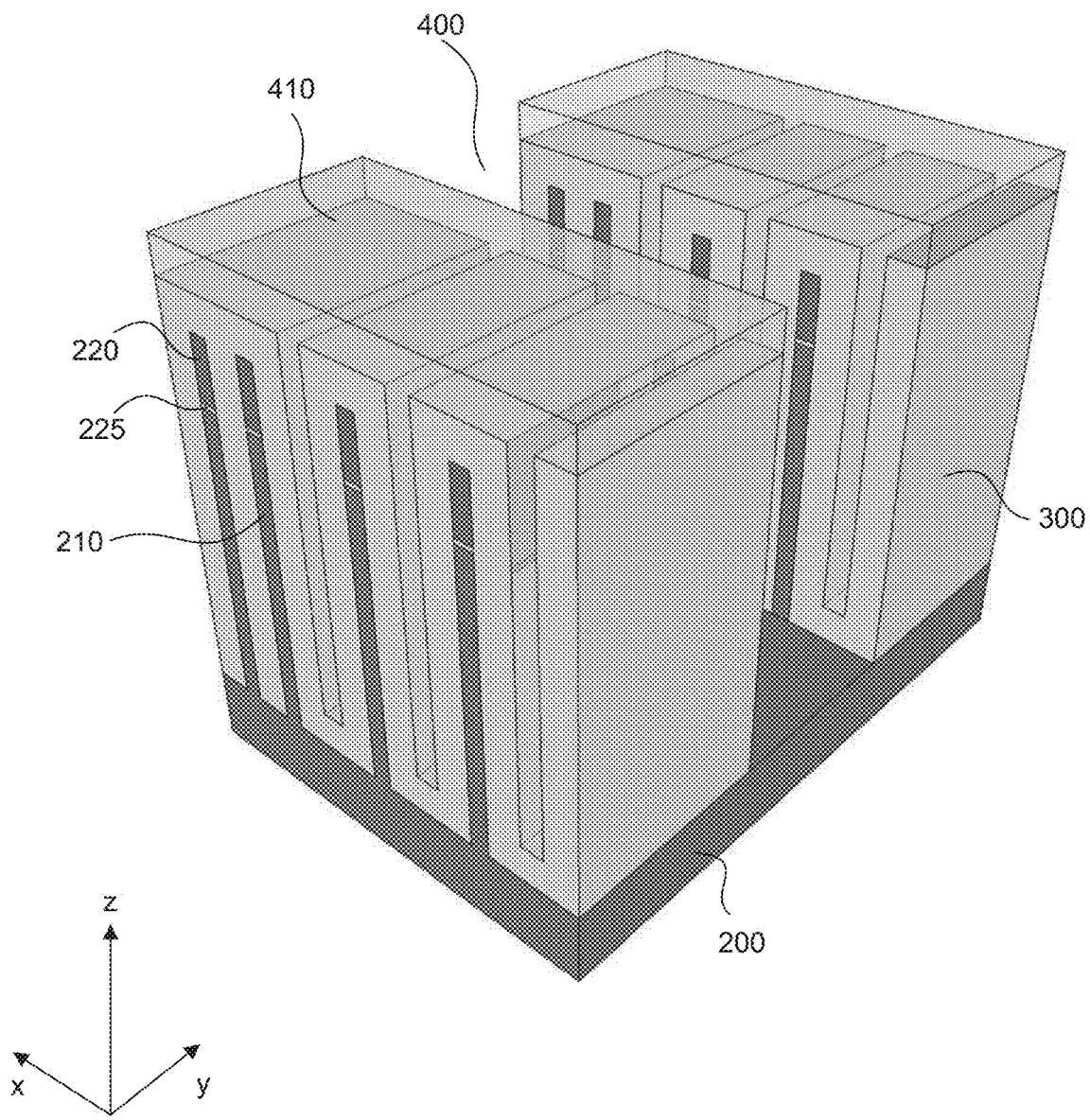
FIG. 4 is an isometric view of a semiconductor fin structure after a fin-patterning process in accordance with some embodiments.

In referring to FIG. 1, method 100 continues with operation 120 and the formation of insulating fins over substrate 200. The insulating fins may not be in physical contact with substrate 200. In some embodiments, the insulating fins can be formed between one or more semiconductor fins 210. By way of example and not limitation, insulating fins can be formed by (i) depositing an oxide layer via a conformal process, such as for example atomic layer deposition (ALD) or chemical vapor deposition (CVD); (ii) subsequently patterning the deposited oxide layer using photolithography and etch operations to form trenches adjacent to semiconductor fins 210; and (iii) depositing an insulating material in the trenches to form insulating fins. Referring to FIG. 3, an oxide layer 300 has been deposited and patterned to form trenches 310 into oxide layer 300. An optional patterning operation can form a "cut" in the fins. In other words, semiconductor fins 210 can be cut widthwise (e.g., along the x-direction) as shown in FIG. 4 to form cut areas 400. During the patterning operation, a photoresist layer 410 is applied and patterned, followed by an etch operation that can remove the middle section of semiconductor fins 210.

After the patterning process, photoresist layer 410 can be stripped and trenches 310 can be filled with an insulating material to form the insulating fins. In some embodiments, the insulating fins can be made of silicon oxy-carbon nitride (SiOCN), silicon oxy-carbide (SiOC) or a metal oxide like hafnium oxide (HfO$_2$) and zirconium oxide (ZrO$_2$).

Figure 5:
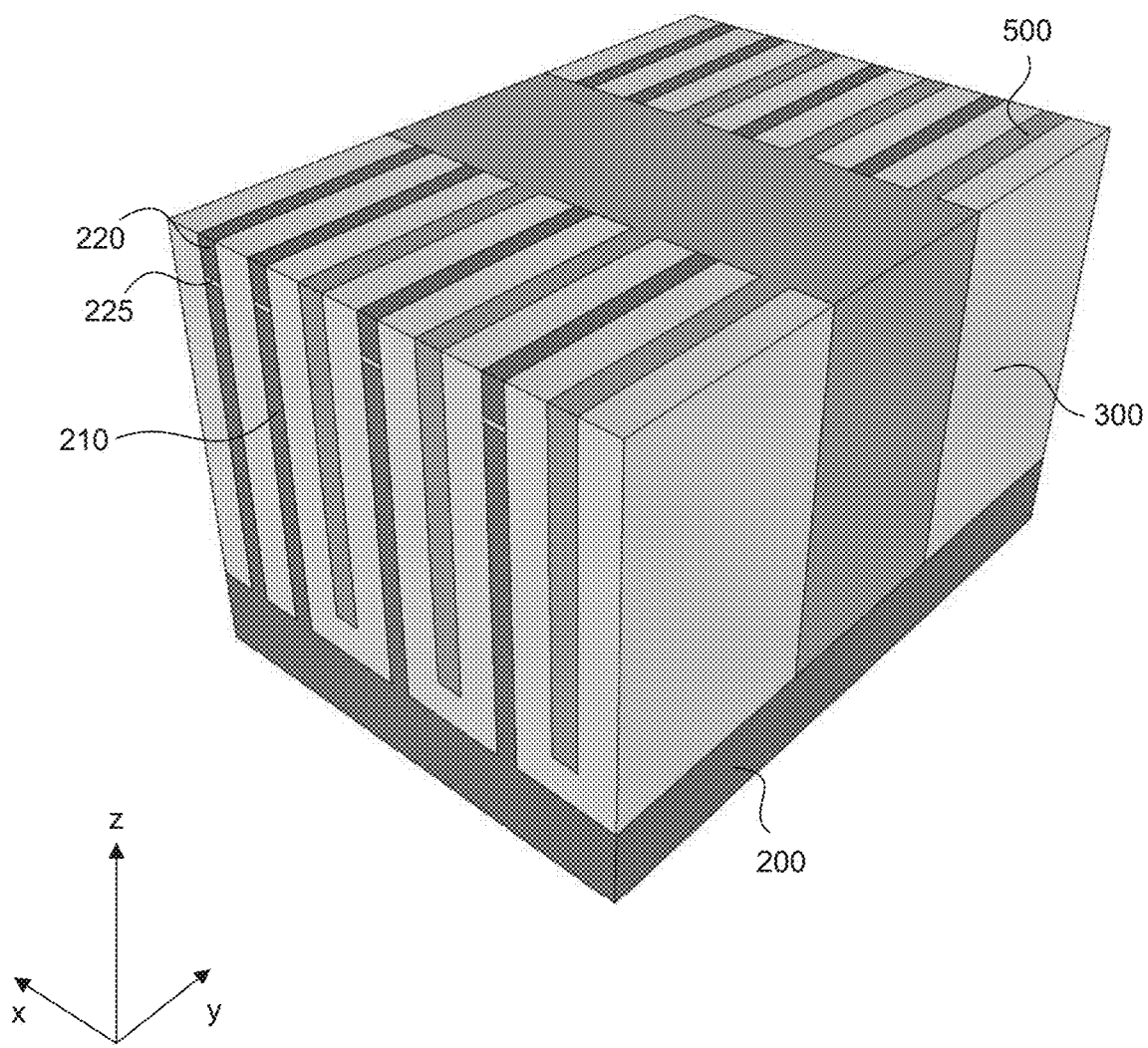
FIG. 5 is an isometric view of a semiconductor and insulating fin structure over a substrate in accordance with some embodiments.

In some embodiments, a chemical mechanical planarization (CMP) operation can remove the insulating material and the oxide layer over hard mask layer 220 until hard mask layer 220 is exposed. Referring to FIG. 5, where the structure is shown after the CMP operation, insulating fins 500 have been formed adjacent to one or more semiconductor fins 210. In some embodiments, the trench structures can be shorter than the height of the fins, and therefore insulating fins 500 may not be in physical contact with substrate 200.

In some embodiments, oxide layer 300 can be a shallow trench isolation (STI) layer. In some embodiments, oxide layer 300 can be silicon oxide (SiO$_2$). By way of example and not limitation, oxide layer 300 can also be silicon nitride (SiN), silicon oxynitride (SiON), fluorine-doped silicate glass (FSG), a low-k dielectric material (e.g., with k-value less than about 3.9), and/or other suitable oxide with appropriate fill properties.

Figure 6:
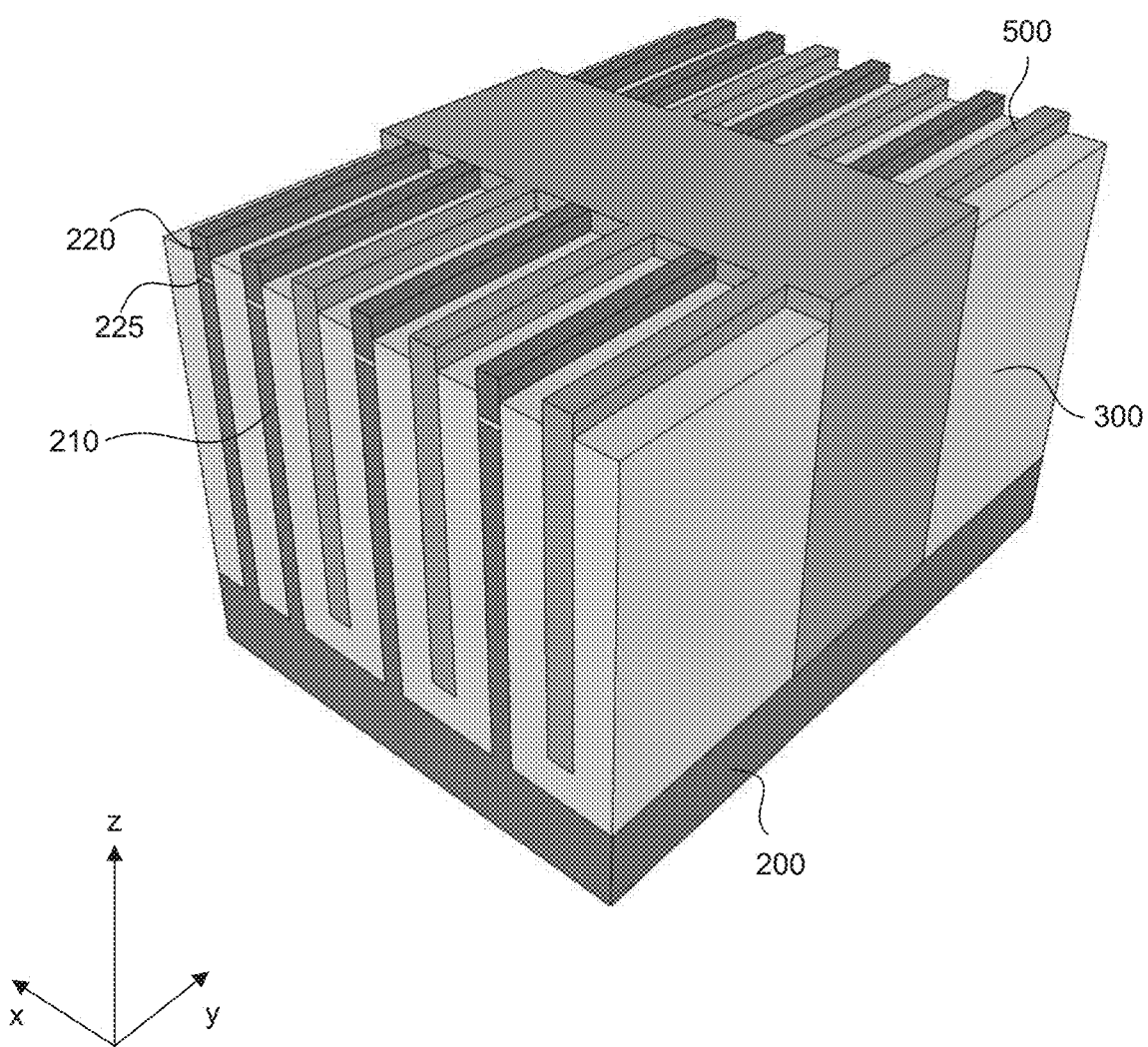
FIG. 6 is an isometric view of a semiconductor and insulating fin structure after an oxide layer recess process in accordance with some embodiments.
Figure 7:
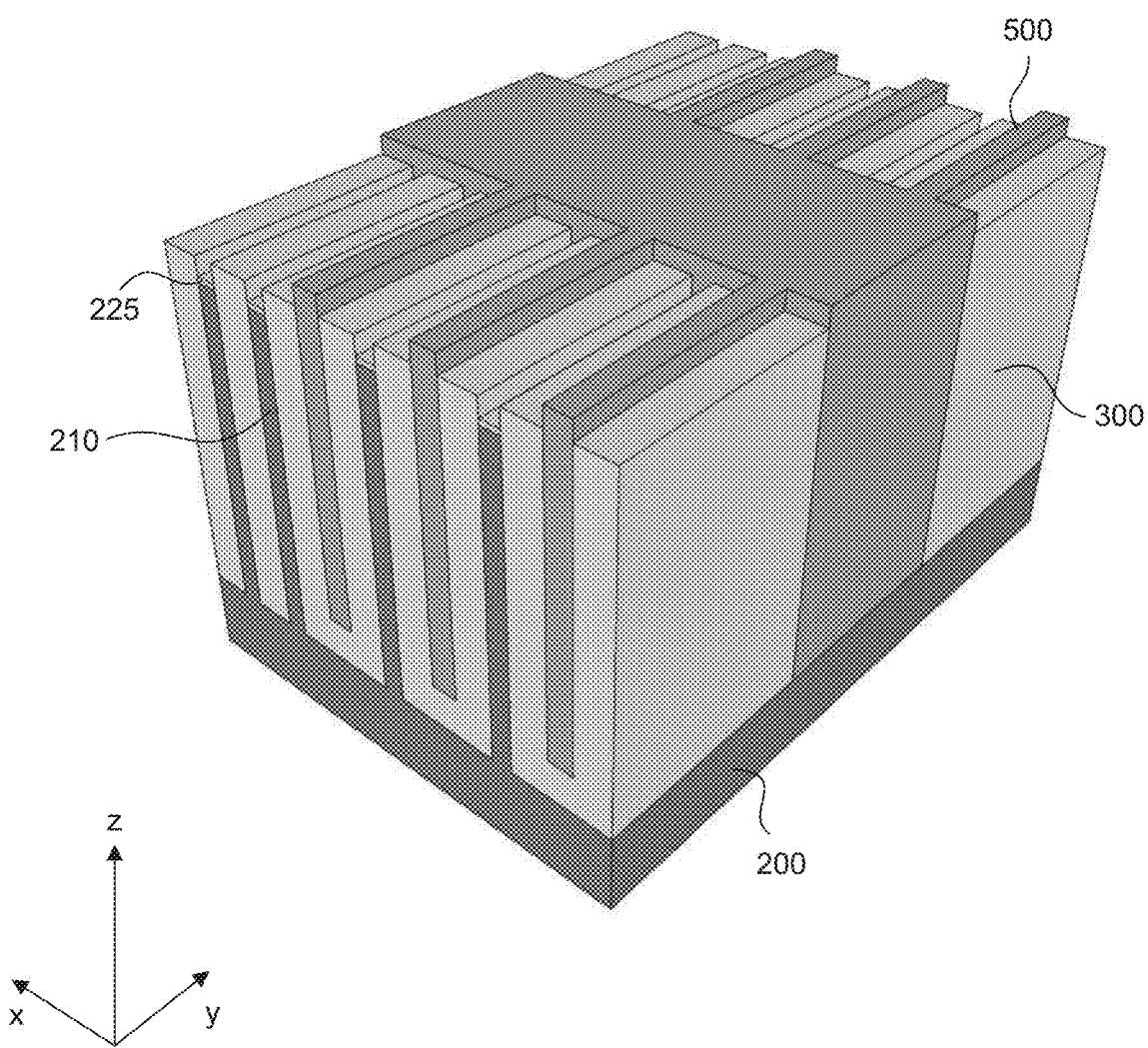
FIG. 7 is an isometric view of a semiconductor and insulating fin structure after a hard mask removal process in accordance with some embodiments.

In referring to FIG. 1, in operation 130, one of the semiconductor fins can be recessed according to some embodiments; for example, it can have its height reduced. In some embodiments, oxide layer 300 can be recessed using an etchback process so that hard mask layer 220 is substantially exposed as shown in FIG. 6. A selective etch process can be used to subsequently remove hard mask layer 220 from the top of fins 210 as shown in FIG. 7. By way of example and not limitation, the etch process that is used to remove hard mask layer 220 can be selective towards hard mask layer 220; for example, it can have a selectivity between about 30:1 to about 60:1. In some embodiments, oxide layer 225 of hard mask 220 is not removed during the etch process.

Figure 8:
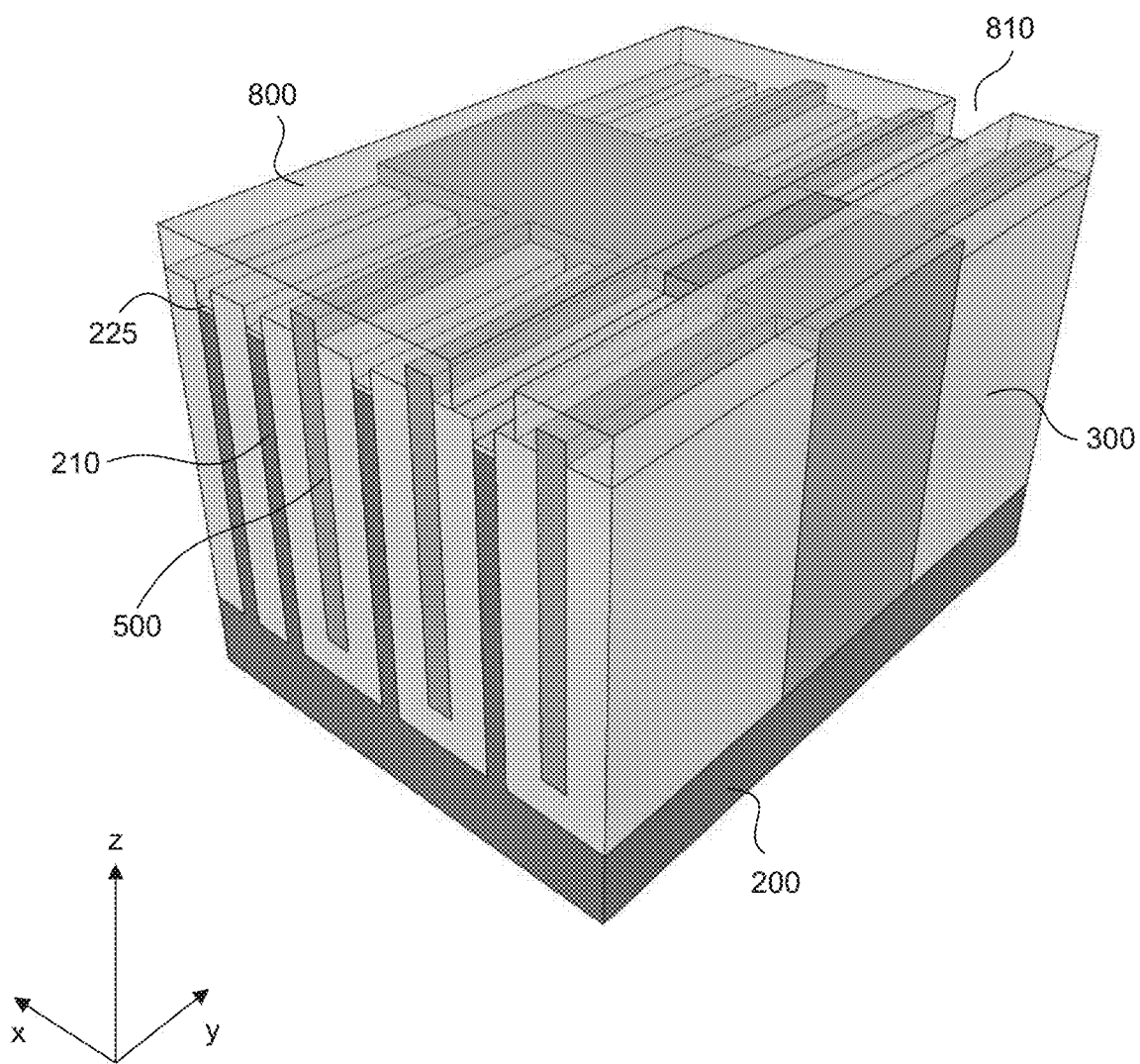
FIG. 8 is an isometric view of a semiconductor and insulating fin structure after a photoresist patterning process in accordance with some embodiments.
Figure 9:
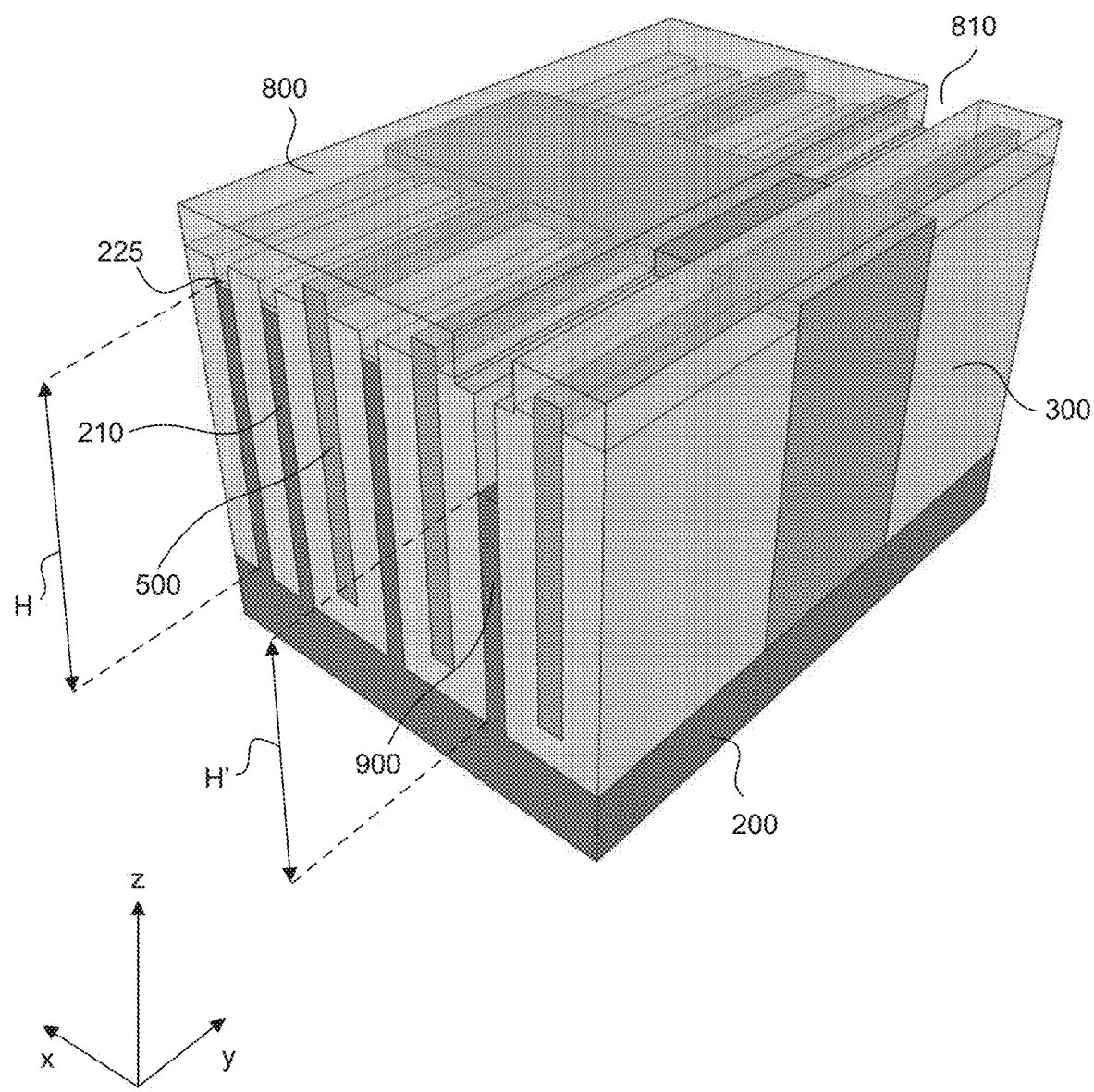
FIG. 9 is an isometric view of a semiconductor and insulating fin structure after a fin recess process in accordance with some embodiments.

By way of example and not limitation, once hard mask layer 220 is removed, a photoresist layer 800 can be applied and patterned so that opening 810 can be formed in photoresist layer 800 to expose a single fin as shown in FIG. 8. The rest of the fins may be covered by photoresist layer 800 and not etched during a subsequent etch operation. In some embodiments, more than one opening 810 may be formed to expose one or more fins. An etch process can be used to remove oxide layer 225, recess the exposed fin and reduce its height from H to H' as shown in FIG. 9. In some embodiments, the exemplary etch process may be performed in more than one stages and may employ a different gas chemistry to remove oxide layer 225 and recess exposed fin 215 in opening 810. In some embodiments, the height ratio H'/H between the recessed semiconductor fin 900 and a non-recessed semiconductor fin 210 can range from about 1:4 to about 2:3. In some embodiments, the etch chemistry for the fin recess can include chlorine-based or fluorine-based gases. After the recess process, photoresist layer 800 can be stripped.

Figure 10:
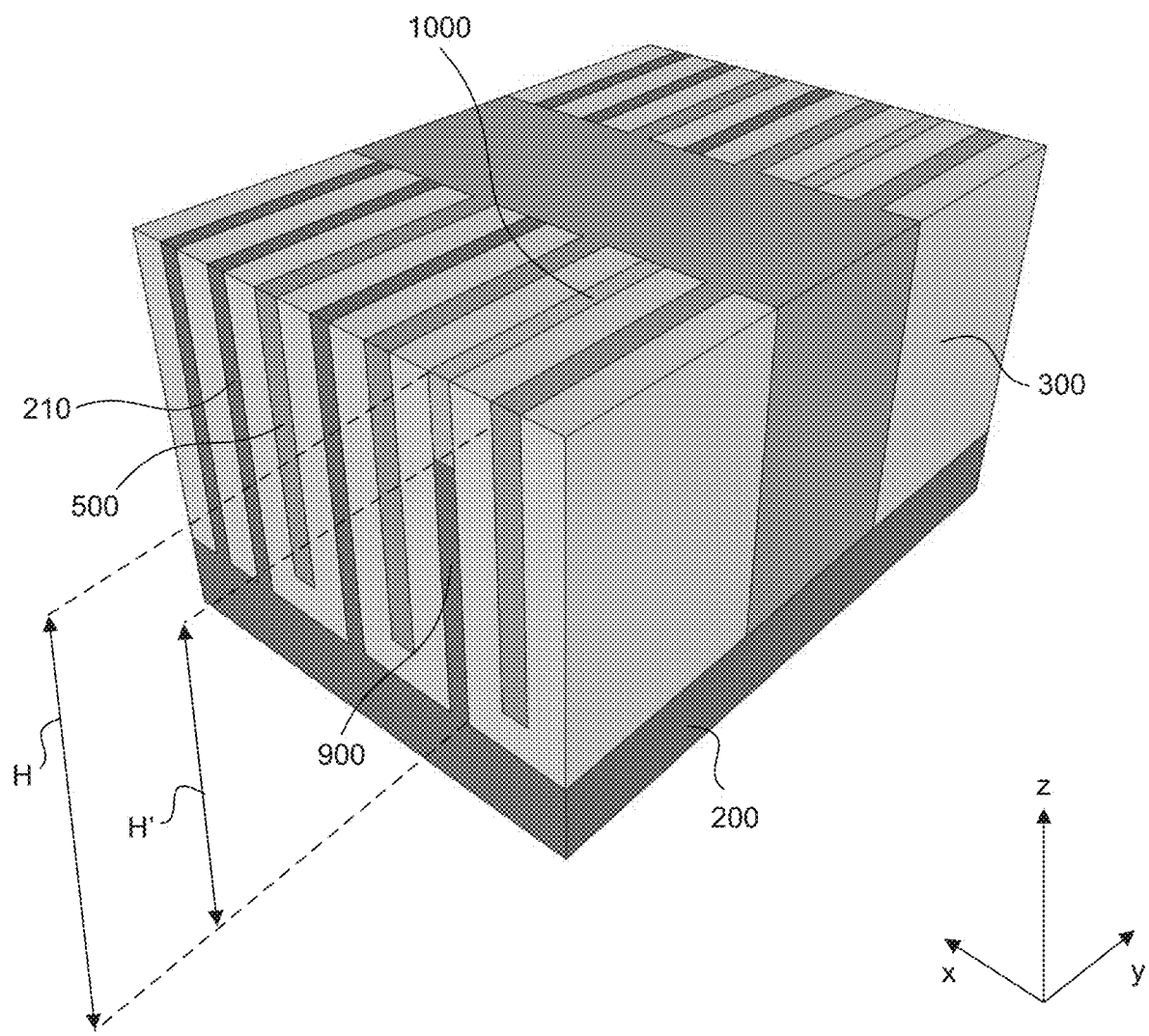
FIG. 10 is an isometric view of a semiconductor and insulating fin structure after a hard mask deposition on a recessed semiconductor fin in accordance with some embodiments.

A hard mask layer can be deposited to fill opening 810 to form hard mask top layer 1000 for recessed fin 900 as shown in FIG. 10. In some embodiments, hard mask top layer 1000 can be SiCN or SiN. In some embodiments, hard mask top layer 1000 can have a thickness range of about 10 nm to about 30 nm (e.g., 10 nm to 20 nm, 20 nm to 30 nm, 5 to 15 nm). In some embodiments, recessed fin 900 and hard mask top layer 1000 form a single fin structure that has a height H, which is nominally equal to the height of non-recessed semiconductor fins 210.

Figure 11:
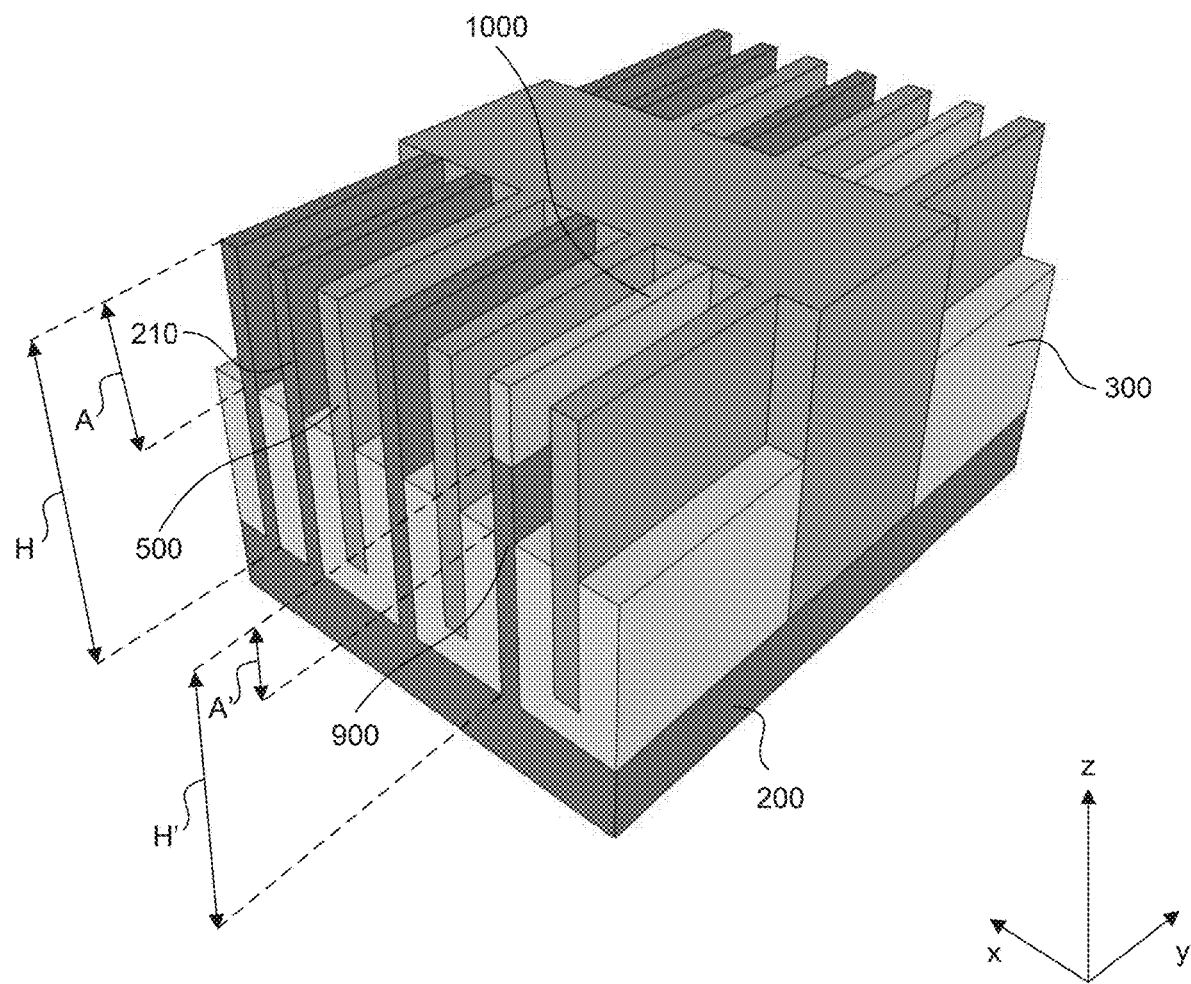
FIG. 11 is an isometric view of a semiconductor and insulating fin structure after an oxide layer recess process in accordance with some embodiments.
Figure 12:
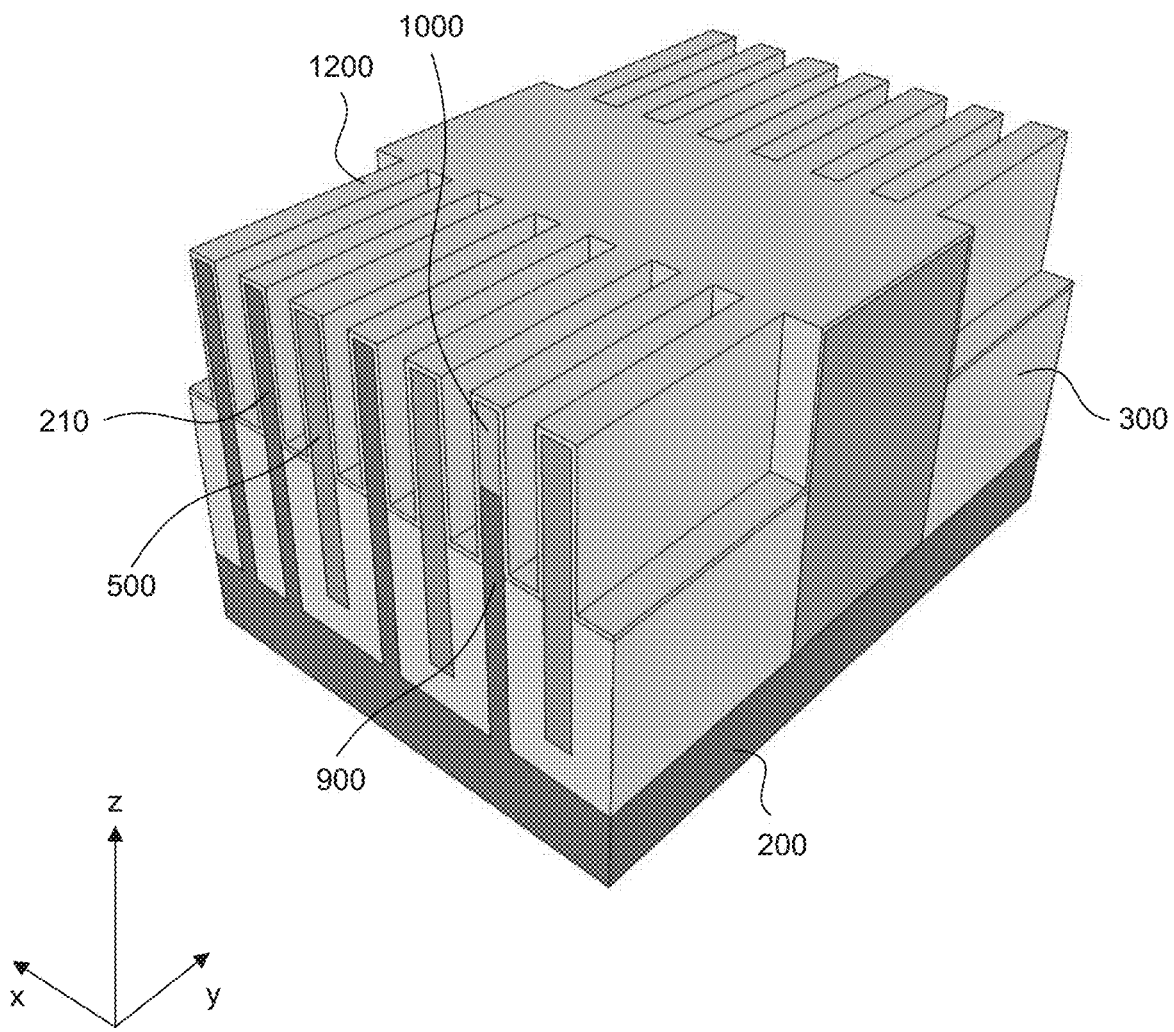
FIG. 12 is an isometric view of a semiconductor and insulating fin structure after an oxide layer deposition process in accordance with some embodiments.

In some embodiments, a selective etchback process can recess oxide layer 300 between semiconductor fins 210, 900 and insulating fins 500 so that one or more of the fins may protrude above oxide layer 300, as shown in FIG. 11. For example, fin 210 may have a height A above recessed oxide layer 300, and recessed fin 900 may have a height A' above recessed oxide 300. According to some embodiments, the height ratio A'/A of protruding portions of non-recessed fins 210 and recessed fin 900, can be equal to fin the height ratio H'/H (e.g., about 1:4 to about 2:3). In some embodiments, an oxide layer 1200 can be deposited to cover the exposed surfaces (e.g., the top and sidewall surfaces) of semiconductor fins 210, 900 and insulating fins 500, as shown in FIG. 12. In some embodiments, oxide layer 1200 is thinner than oxide layer 300 and its purpose is to protect semiconductor fins 210, 900 and insulating fins 500 from subsequent processing operations. In some embodiments, oxide layer 1200 can be SiO$_2$. Alternatively, oxide layer 1200 can be SiON or FSG.

Figure 13:
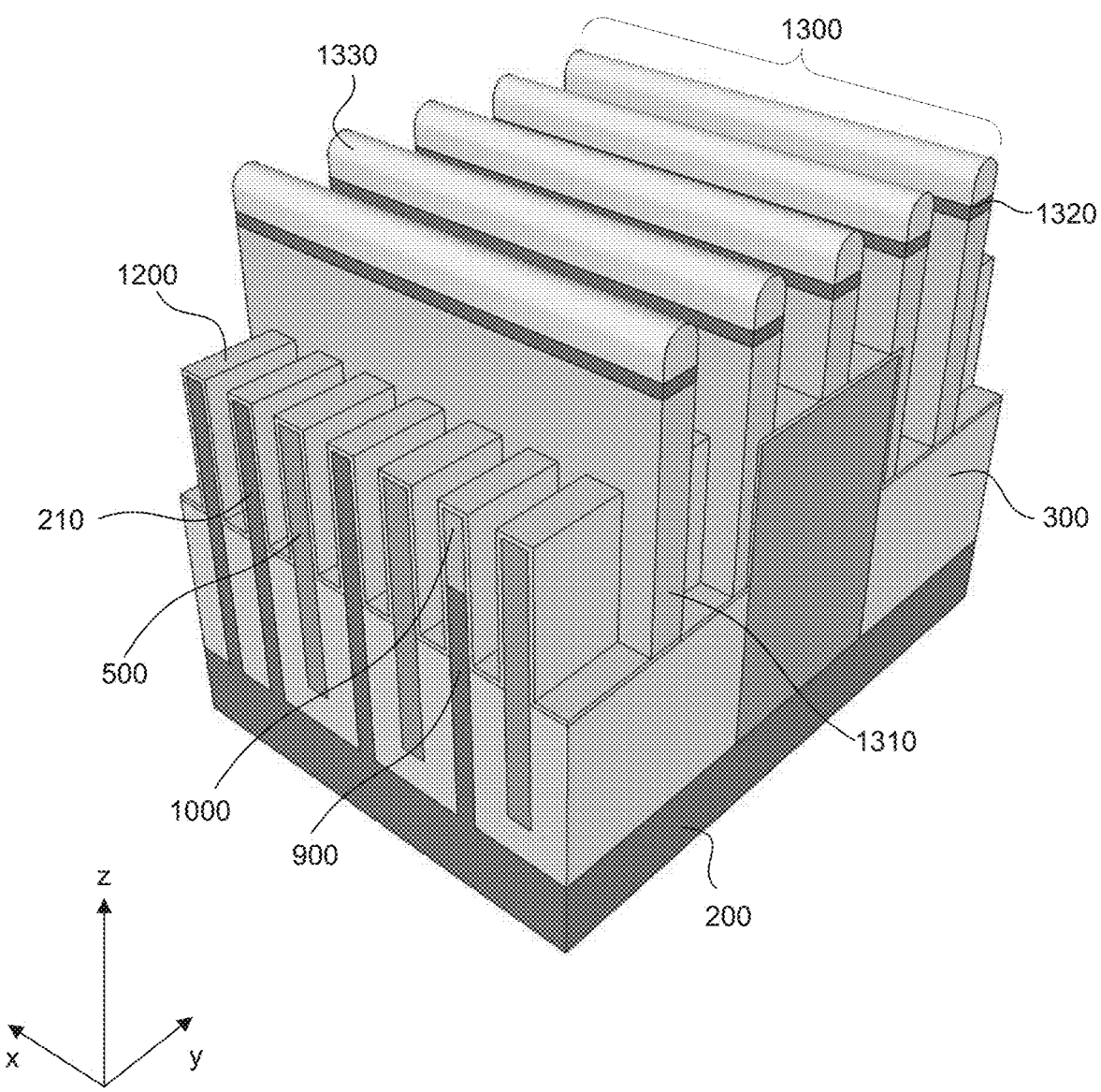
FIG. 13 is an isometric view of a semiconductor and insulating fin structure after a sacrificial gate structure formation in accordance with some embodiments.

In referring to FIG. 1, in operation 140, sacrificial gate structures 1300 can be formed perpendicular to the direction of the fins (e.g., along the x-direction), as shown in FIG. 13. In some embodiments, gate structures 1300 can include a sacrificial gate electrode 1310, a capping layer 1320 and an oxide layer 1330. In some embodiments, a sacrificial gate oxide is deposited prior to sacrificial gate electrode 1310. The sacrificial gate electrode can be SiO$_2$ according to some embodiments, and can be replaced with a high dielectric constant (high-k) material in subsequent operations. For simplicity, the sacrificial gate oxide is not shown in FIG. 13. In some embodiments, sacrificial gate structures 1300 can be replaced with metal gates in later operations. In some embodiments, sacrificial gate electrode 1310 can be, for example, polysilicon. By way of example and not limitation, sacrificial gate electrode 1310 can be deposited as a blanket polysilicon film that can be subsequently patterned with photolithography and etch operations.

Figure 14:
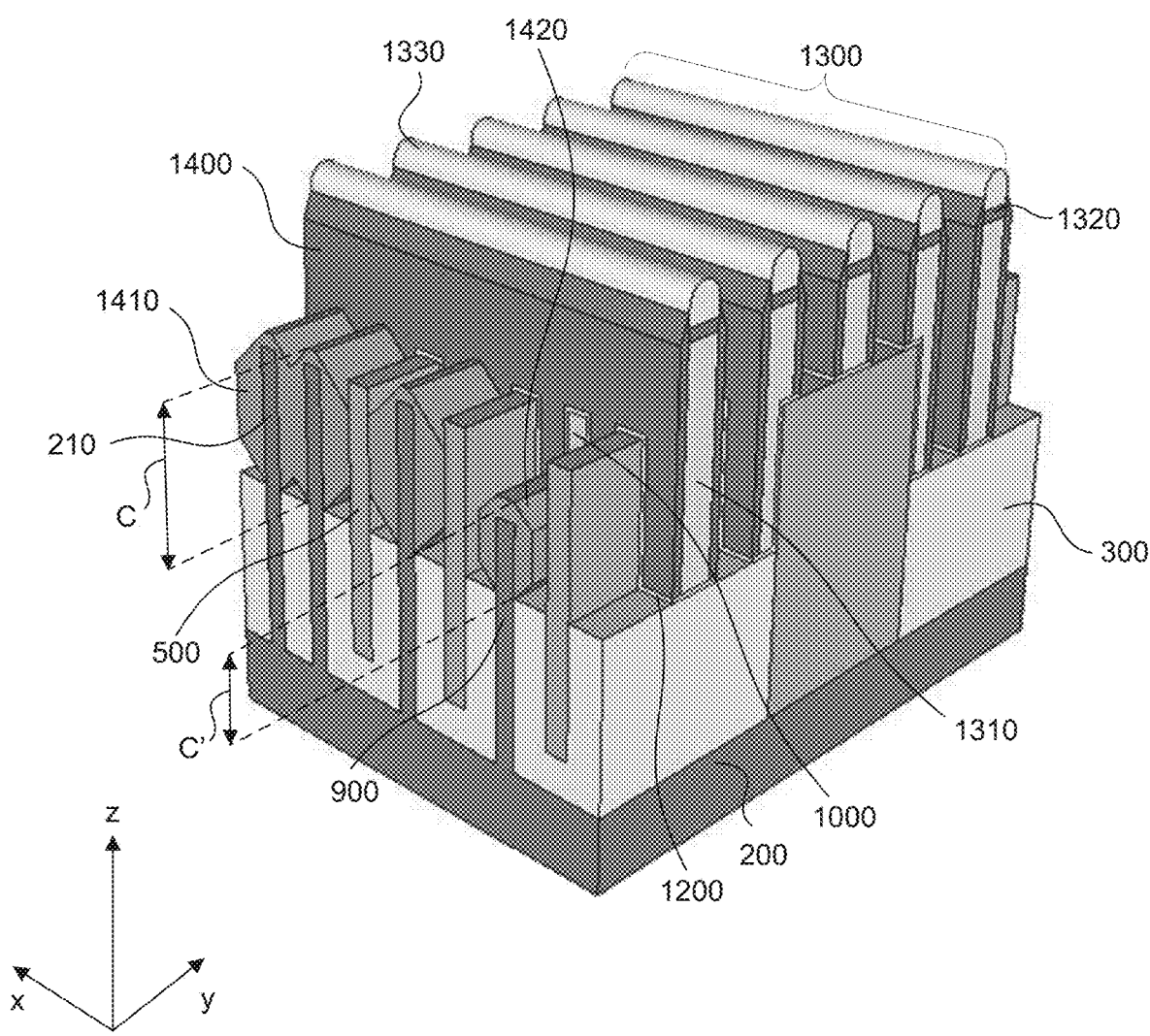
FIG. 14 is an isometric view of a semiconductor and insulating fin structure after a spacer and epitaxial stack formation in accordance with some embodiments.

In some embodiments, spacers 1400 are formed on the sidewalls of sacrificial gate structures 1300 as shown in FIG. 14. Spacers 1400 can function as alignment masks during an ion implantation operation for the formation of the source/drain regions in semiconductor fins 210 and 500. By way of example and not limitation, spacers 1400 can be deposited as a blanket film that can be etched with an etchback process to form the spacers on the sidewalls of sacrificial gate structure 1300. In some embodiments, the etchback process is anisotropic so that the spacer material is removed faster on horizontal surfaces (e.g., in the x- and y-direction) compared to vertical surfaces (e.g., in the z-direction). Since the spacer material is blanket deposited, it can cover the exposed surfaces including semiconductor fins 210, 900 and insulating fins 500. A fin sidewall pull back process can remove the spacer material from the fins' sidewalls.

In some embodiments, spacers 1400 can be grown selectively on exposed polysilicon material, such as sacrificial gate electrode 1310. In this case, an etchback process may not be necessary.

In some embodiments, spacers 1400 can be made of a dielectric material, such as SiO$_2$, SiON, SiCN, silicon oxycarbide (SiO$_x$C$_y$), or SiN. In some embodiments, the thickness of spacers 1400 can range from about 2 nm to about 5 nm. Spacers 1400 can be a stack of one or more layers made of the same or different materials. According to some embodiments, spacers 1400 are not removed during the dummy gate stack removal process and can function as structural elements for a metal gate structure.

In some embodiments, another selective etchback process can be used to remove oxide layer 1200 (shown in FIG. 13)

from the exposed surfaces (e.g., the top and sidewall surfaces) of semiconductor fins 210, 900 and insulating fins 500, as shown in FIG. 14.

In referring to FIG. 1, in operation 150, an epitaxial stack can be grown on each of the semiconductor fins as shown in FIG. 14. In some embodiments, epitaxial stack 1410 can be grown on semiconductor fins 210 and epitaxial stack 1420 can be grown on the recessed semiconductor fin 900. The height of an epitaxial stack can be measured, for example, from the top of recessed oxide 300 at the base of the fin to the tip of epitaxial stack above the fin. According to some embodiments, epitaxial stack 1420 has a height C' that is smaller than height C of epitaxial stack 1410. In some embodiments, the height ratio C'/C of epitaxial stacks 1420 and 1410 can range from about 1:4 to about 2:3. The height difference between epitaxial stack 1420 and 1410 can be attributed to the reduced height H' of recessed semiconductor fin 900, and therefore to a reduced surface area of recessed semiconductor fin 900 that is available to participate in the epitaxial growth process of epitaxial stack 1420. In some embodiments, epitaxial stacks 1410 and 1420 can be either a p-type S/D or an n-type S/D. In some embodiments, the reduced size of epitaxial stack 1420 can reduce the parasitic capacitance between the S/D region of the recessed semiconductor fin 900 and a metal gate structure. Further, the reduced size of epitaxial stack 1420 can reduce the power consumption for the finFETs formed on recessed semiconductor fin 900.

For example purposes, epitaxial stacks 1210 and 1220 in method 100 will be described in the context of boron (B) doped (p-type) SiGe epitaxial stacks. Based on the disclosure herein, n-type silicon (Si) epitaxial stacks (e.g., phosphorous (P) doped, carbon (C) doped, etc.) can also be used. These materials are within the spirit and scope of this disclosure.

In some embodiments, a B-doped (p-type) SiGe S/D can be an epitaxial stack that can include two or more epitaxial layers grown in succession and can feature different germanium (Ge) atomic % and different B dopant concentrations. By way of example and not limitation, the first layer can have a Ge atomic % that ranges from 0 to about 40%, and a B dopant concentration that ranges from about $5 \times 10^{19}$ atoms/cm$^3$ to about $1 \times 10^{21}$ atoms/cm$^3$. The second epitaxial layer can have a Ge atomic % that ranges from about 20% to about 80%, and a B dopant concentration that ranges from about $3 \times 10^{20}$ atoms/cm$^3$ to about $5 \times 10^{21}$ atoms/cm$^3$. Finally, the third epitaxial layer can be a capping layer that can have similar Ge atomic % and B dopant concentrations as the first layer (e.g., 0 to about 40% for Ge, and about $5 \times 10^{19}$ atoms/cm$^3$ to about $1 \times 10^{21}$ atoms/cm$^3$ for B dopant). The thickness of these layers can vary depending on the device performance requirements. For example, the first epitaxial layer can have a thickness range from about 10 nm to about 20 nm, the second epitaxial layer can have a thickness range from about 30 nm to about 60 nm, and the third epitaxial layer (capping layer) can have a thickness range from 0 to about 10 nm.

In some embodiments, insulating fins 500 can prevent physical and electrical contact between adjacent epitaxial stacks 1410 and 1420 of neighboring semiconductor fins 210 and 900. In other words, insulating fins 500 can electrically isolate neighboring epitaxial stacks 1410 and 1420. In some embodiments, insulating fins 500 can restrict the lateral growth of epitaxial stacks 1410 and 1420 in the x-direction, and sacrificial gates 1300 can restrict the growth of epitaxial stacks 1410 and 1420 in the y-direction.

Figure 15:
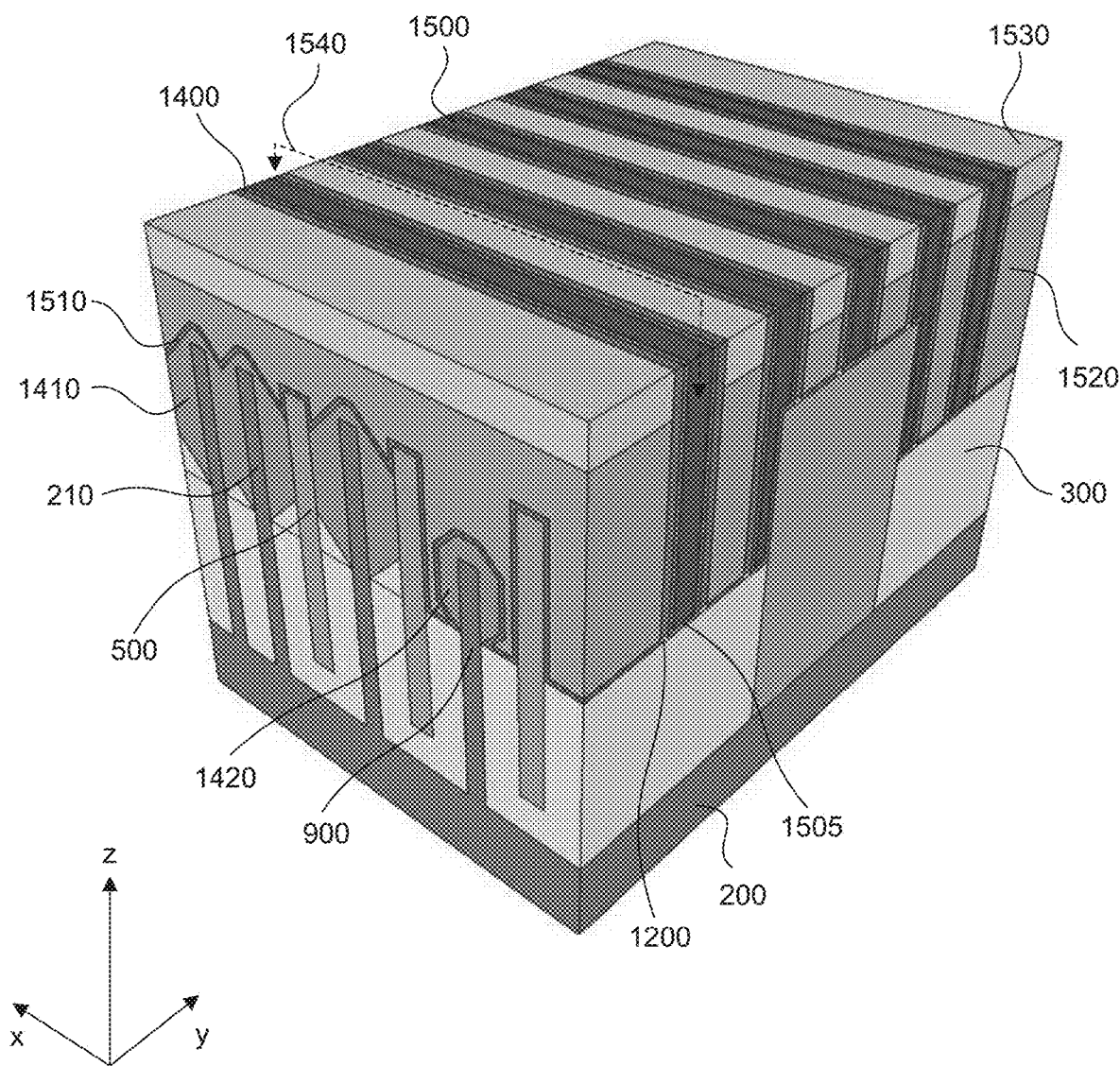
FIG. 15 is an isometric view of a semiconductor and insulating fin structure after formation of an amorphous silicon layer and a metal gate replacement process in accordance with some embodiments.

Referring to FIG. 15, after the epitaxial stack formation, a protective nitride layer 1510 can be deposited over epitaxial stacks 1410 and 1420, semiconductor fins 210 and 900, and insulating fins 500. In some embodiments, the nitride layer can have a thickness that ranges from about 3 nm to about 5 nm. By way of example and not limitation, the protective nitride layer 1510 can be deposited by a conformal deposition process, such as ALD, plasma enhanced ALD (PEALD), CVD, plasma enhanced CVD (PECVD), or any other appropriate deposition method. For example, protective nitride layer 1510 can be deposited with an ALD process at about 500° ° C. According to some embodiments, protective nitride layer 1510 can function as an etch stop layer (ESL) in a subsequent etch process that is described later. In some embodiments, an amorphous Si (α-Si) layer 1520 can be deposited over the protective nitride layer 1510. Further, a hard mask layer 1530 can be deposited over α-Si layer 1520 thereafter to protect α-Si 1520 during a subsequent gate replacement process. In some embodiments, the hard mask layer can be a SiN layer with a thickness that ranges from about 15 nm to about 40 nm. In some embodiments, α-Si layer can be a sacrificial layer that can be replaced in a subsequent operation.

In referring to FIG. 1, in operation 160, sacrificial gate structures 1300 (shown in FIG. 14) can be replaced with metal gate structures 1500 (shown in FIG. 15). Additionally, isolation regions can be formed in metal gate structures 1500. In some embodiments, sacrificial gate stacks 1300 can be removed with a wet etch process that is selective towards polysilicon material. The selectivity can be greater than about 1000:1 (e.g., 10000:1) so that spacers 1400 are not removed during the wet etch operation. In some embodiments, a metal gate stack 1500 is deposited to replace the etched polysilicon material.

By way of example and not limitation, metal gate stack 1500 can include an interfacial layer (IL), a high-k dielectric (e.g., with a k-value greater than 3.9) 1505, and one or more metal stacks. In FIG. 15, sacrificial gate structures 1300 of FIG. 14 have been replaced with metal gate structures 1500. For illustration purposes, FIG. 15 includes select portions of a semiconductor structure and other portions (not shown) may be included. For example, the IL, and the one or more metal stacks of metal gate structures 1500 may be included.

In some embodiments, isolation regions can be formed in metal gate structures 1500 to "divide" the metal gate into predetermined sections. By way of example and not limitation, the isolation regions in metal gate structures 1500 can be formed with photolithography and etch operations. For example, a photoresist layer can be coated over the top surface of hard mask 1530 and metal gate structures 1500. The photoresist layer can be patterned such that openings are formed in the photoresist that expose portions of metal gate structures 1500. In some embodiments, the openings in the photoresist layer are aligned with one or more of the underlying insulating fins 500. An etch process can remove the metal gate structure material through the openings in the photoresist layer until the top surface of insulating fins 500 is exposed. A number of isolation trenches, which extent to insulating fins 500, can be formed in metal gate structures 1500. After the etch operation, the photoresist layer can be stripped and a nitride layer can be deposited to fill the trenches in metal gate structures 1500 to form isolation regions. In some embodiments, the isolation trenches can be filled with SiN.

Figure 16:
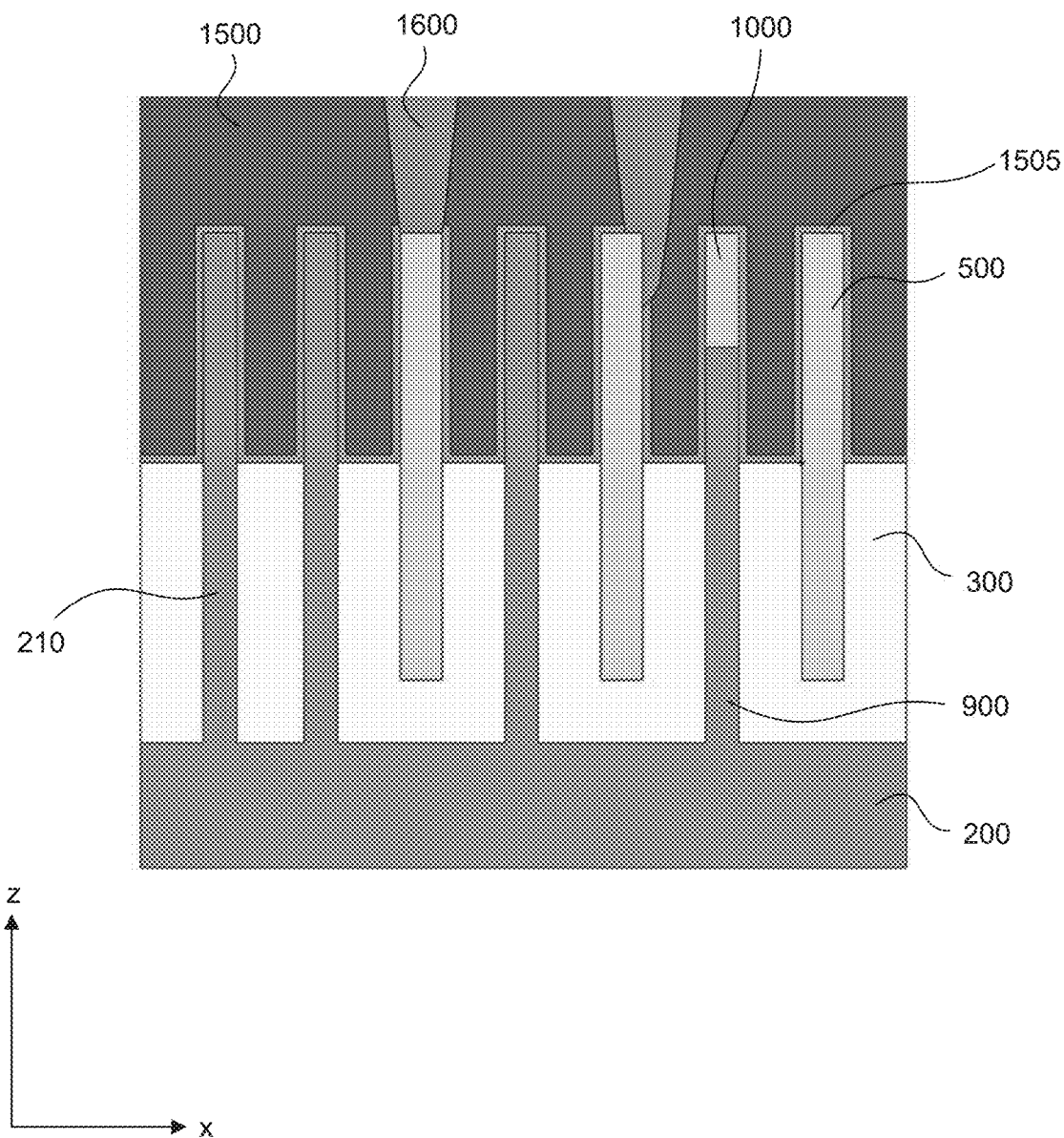
FIG. 16 is a cross-sectional view of a semiconductor and insulating fin structure after formation of isolation regions in a metal gate structure in accordance with some embodiments.

FIG. 16 is a cross-sectional view across line 1540 of FIG. 15 that shows the formed isolation regions 1600. In some embodiments, isolation regions 1600 can reduce a parasitic capacitance between a metal gate structure 1500 and semiconductor fins 210 and 900. According to some embodiments, isolation regions 1600 can reduce a parasitic capacitance between a metal gate structure 1500 and epitaxial stacks 1410 and 1420.

Figure 17:
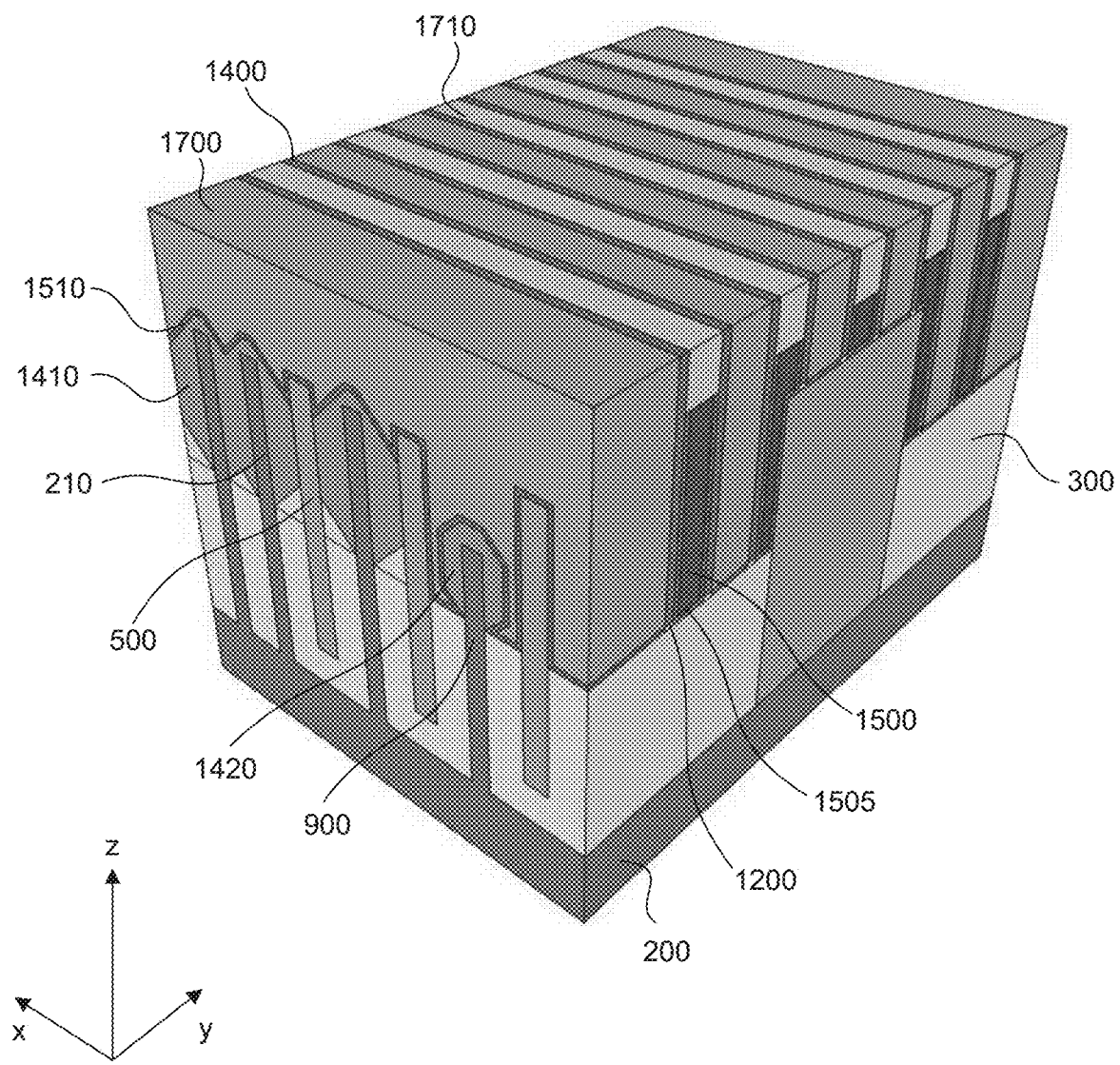
FIG. 17 is a cross-sectional view of a semiconductor and insulating fin structure after a spin-on-carbon layer deposition in accordance with some embodiments.

In referring to FIG. 1, in operation 170, metal contacts can be formed on epitaxial stacks 1410 and 1420 according to some embodiments. In preparation for the metal contact formation, α-Si layer 1520 shown in FIG. 15 can be replaced with a fullerene-based spin-on-carbon (SoC) layer. The SoC layer exhibits improved etch characteristics compared to oxide layers. For example, an etch process may have higher selectivity towards SoC compared to an oxide. By way of example and not limitation, the SoC layer can be spin-coated after the removal of α-Si layer 1520. FIG. 17 shows SoC layer 1700 after the replacement of α-Si layer 1520 and a subsequent CMP operation, according to some embodiments. FIG. 17 also shows etch stop layers 1710 over each metal gate stack 1500. Etch stop layers 1710 may have been deposited and patterned prior to the SoC formation. In some embodiments, etch stop layers 1710 can be, for example, SiN or SiCN.

In some embodiments, SoC layer 1700 can be patterned and etched so that SoC material may remain on areas where the metal contacts can be formed (e.g., above epitaxial stacks 1410 and 1420). In areas where SoC layer 1700 has been etched, an oxide layer can be deposited according to some embodiments. In some embodiments, the oxide layer can be an interlayer dielectric (ILD) layer. In some embodiments, the ILD layer can be $SiO_2$, SiOC, SiON, SiOCN, or SiCN.

Figure 18:
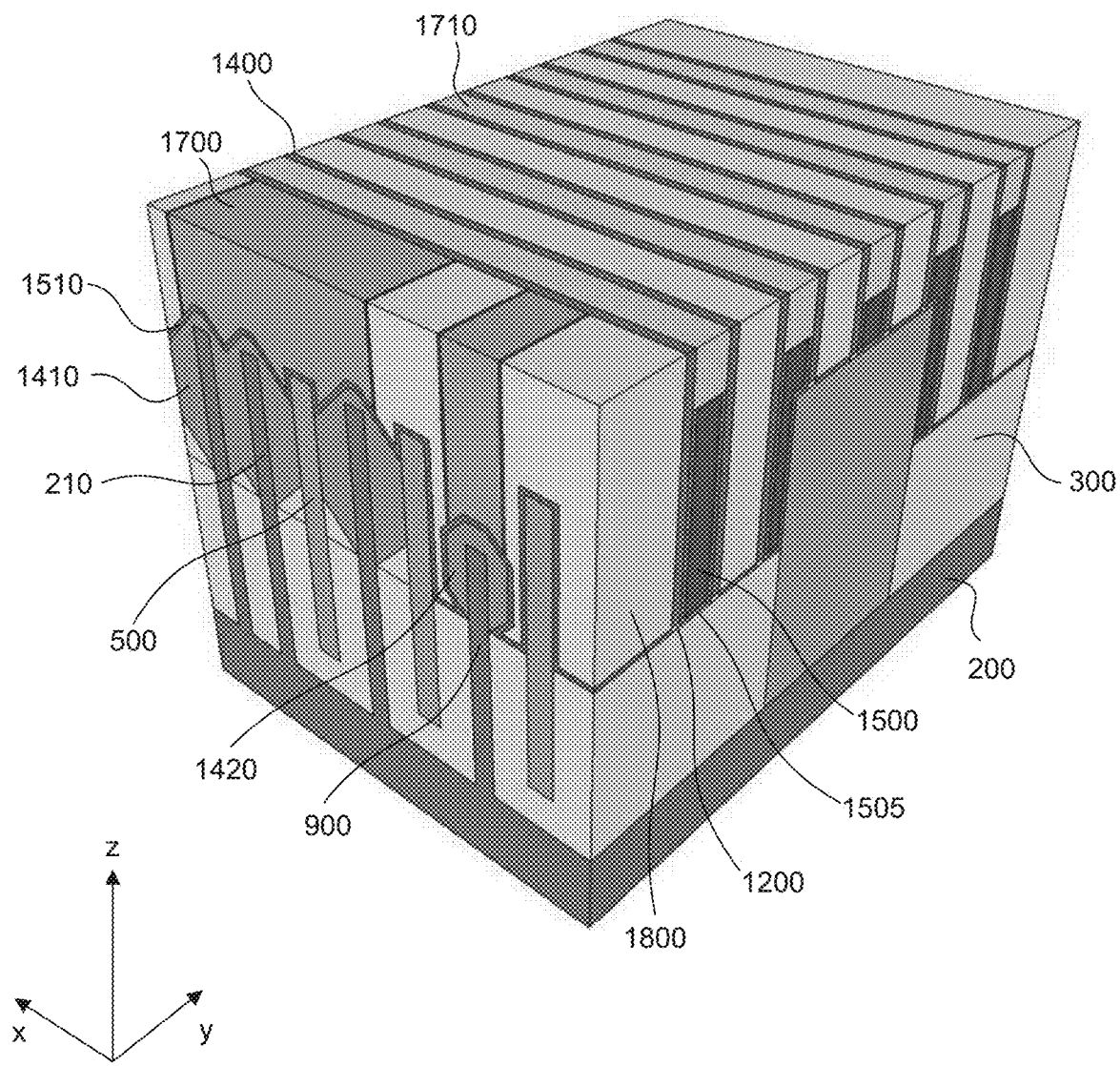
FIG. 18 is a cross-sectional view of a semiconductor and insulating fin structure after portions of a spin-on-carbon layer have been replaced with an oxide layer in accordance with some embodiments.

In some embodiments, the ILD layer can provide electrical isolation between metal gate structures 1500 and the metal contacts that will be formed adjacent to metal gate structures 1500. The oxide layer can be deposited with CVD, physical vapor deposition (PVD), can be thermally grown, or deposited with another appropriate deposition method. According to some embodiments, FIG. 18 shows SoC material 1700 on top of epitaxial stacks 1410 and 1420 where metal contacts can be formed. FIG. 18 also shows oxide layer 1800 that has replaced SoC layer 1700 in areas where metal contacts cannot be formed.

In some embodiments, the remaining areas covered with SoC material can be etched with a etch process so that the SoC material can be replaced with a metal or a metal stack. By way of example and not limitation, the etch process used can be selective towards SoC. For example, the etch process may have a higher etch rate for SoC and a lower etch rate for oxide or nitride. For example, the etch process may exhibit an etch selectivity ratio greater than 100:1 (e.g., 1000:1) for SoC. As a result, the etch process may remove SoC material and stop on nitride layer 1510 above epitaxial stack 1410 while it continues to remove SoC material on top of epitaxial stack 1420. The etch stop process can be terminated once the SoC material is removed from the top of epitaxial stacks 1410 and 1420.

Prior to metal deposition, a second etch process (e.g., an argon sputtering process and/or a SiCoNi process) can be used to remove nitride layer 1510 from the top of epitaxial stacks 1410 and 1420 and prepare the surfaces of epitaxial stacks 1410 for the subsequent metal deposition (e.g., remove a native oxide formed on epitaxial stacks 1410). The second etch process can be a chemical etch, a physical etch or a combination thereof. During the second etch process the top surfaces of epitaxial stacks 1410 and 1420 may be flattened and the height of epitaxial stacks 1410 and 1420 may be reduced by an equal amount.

Figure 19:
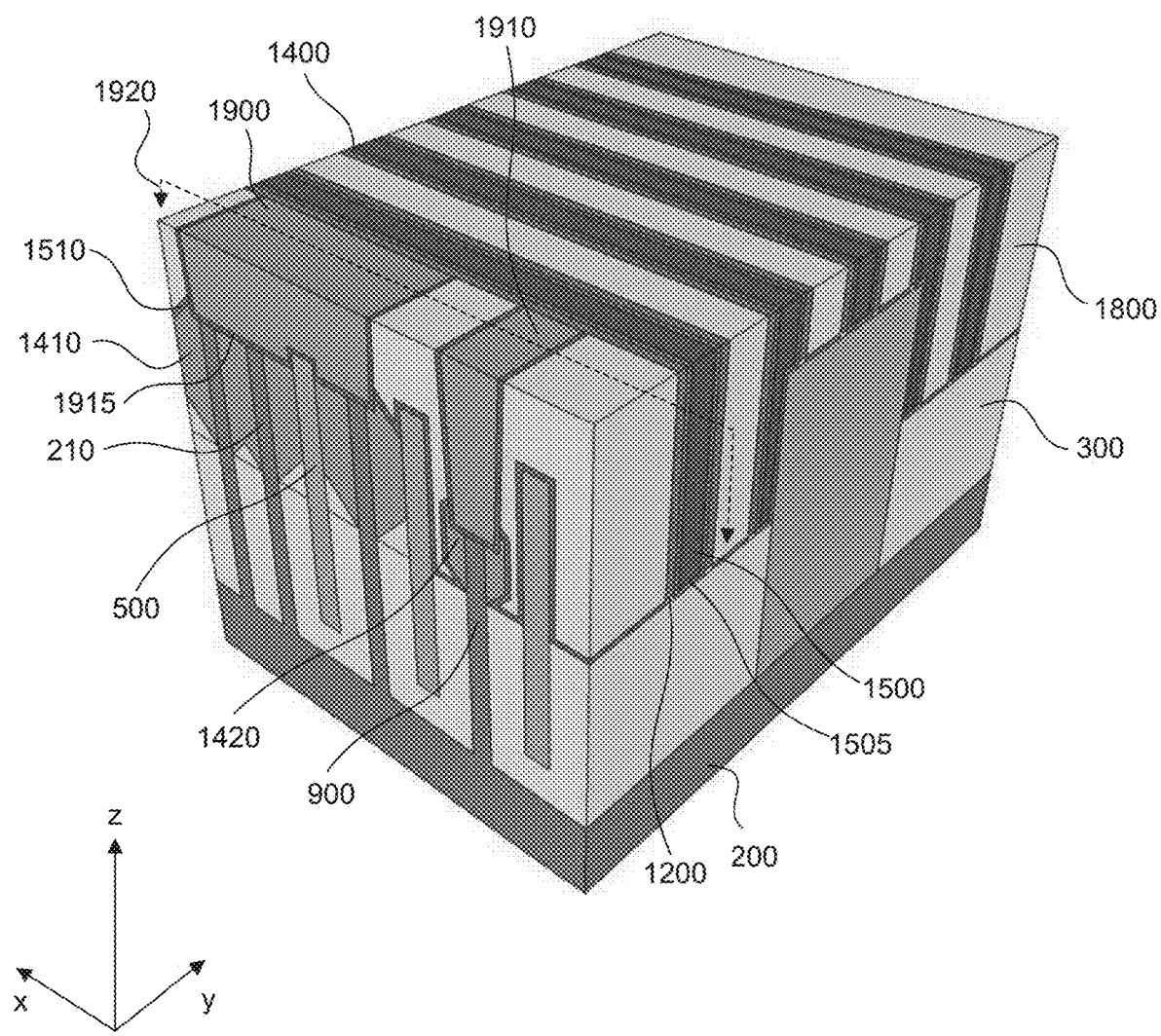
FIG. 19 is a cross-sectional view of a semiconductor and insulating fin structure after formation of metal contacts in accordance with some embodiments.
Figure 20:
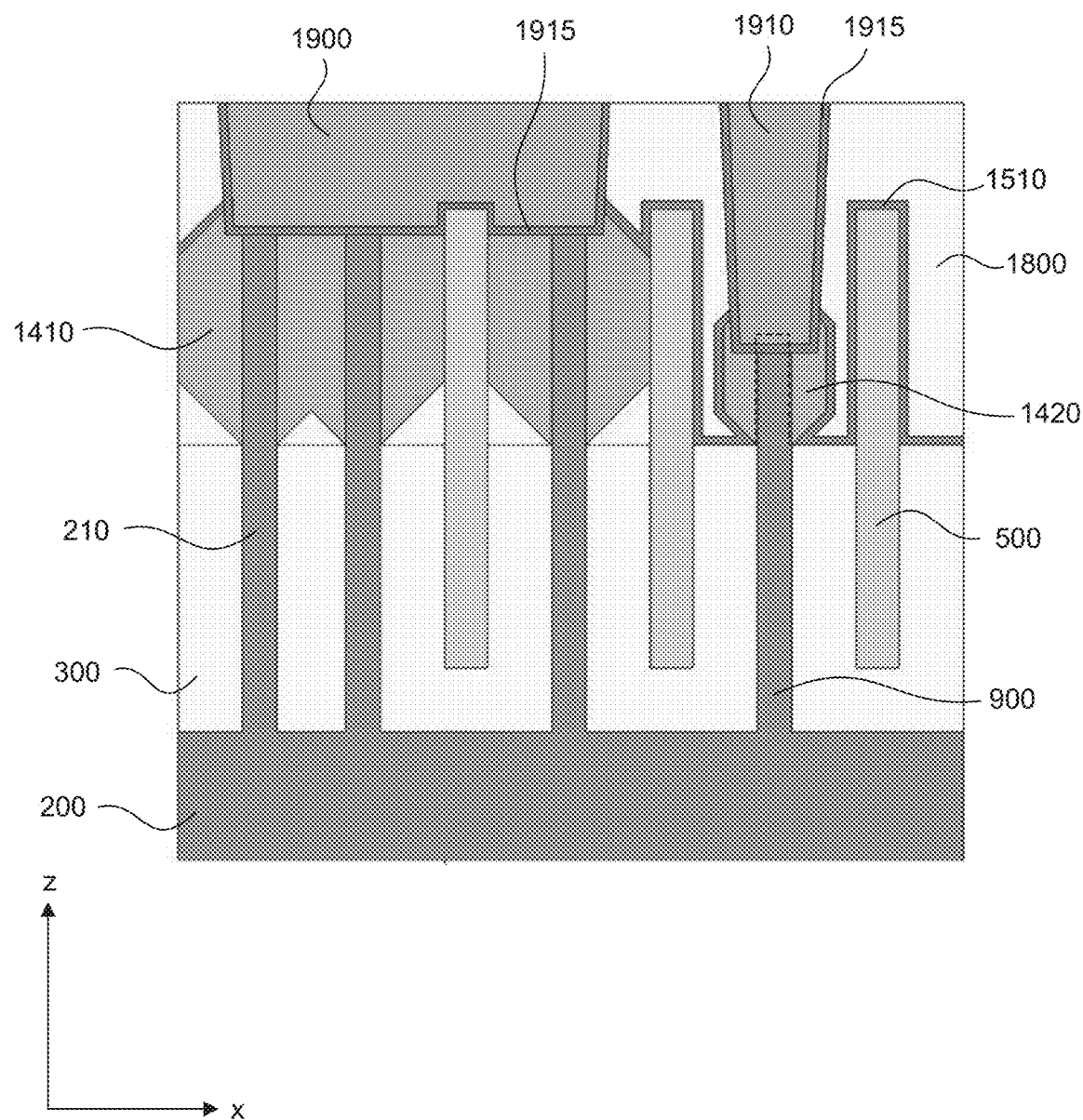
FIG. 20 is a cross-sectional view of a semiconductor and insulating fin structure after formation of metal contacts in accordance with some embodiments.

In some embodiments, the metal can be cobalt (Co). According to some embodiments, the metal can be tungsten (W). FIG. 19 shows metal contact 1900 on top of epitaxial stack 1410 and metal contact 1910 on top of epitaxial stack 1420 according to some embodiments. In some embodiments, metal contact 1910 is shorter than metal contact 1900 as a result of the etch process and the selectivity of SoC material, as discussed above. In some embodiments, a barrier layer 1915 is deposited before the metal in metal contacts 1900 and 1910. Barrier layer 1915 can be a stack of materials. For example, according to some embodiments, barrier metal 1915 can be a stack that includes a bottom layer of titanium (Ti) deposited by a PVD process and a top layer of titanium nitride (TiN) deposited by an ALD or CVD process. By way of example and not limitation, barrier metal layer 1915 can have a thickness that ranges from about 10 nm to about 14 nm. FIG. 20 is a cross-sectional view of FIG. 19 across line 1920.

Figure 21:
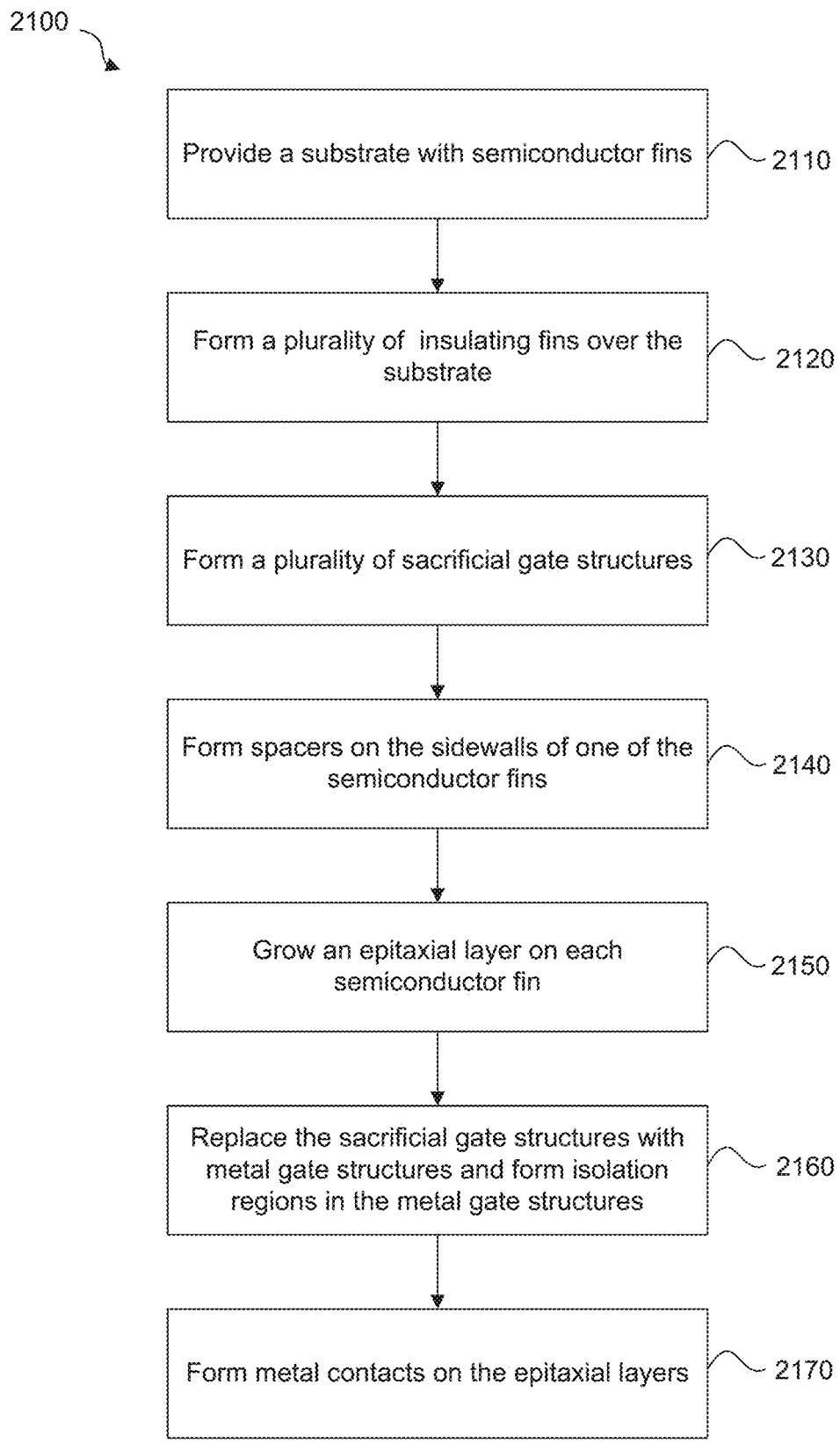
FIG. 21 is a flow diagram of a fabrication method of a single fin structure with a source/drain (S/D) height reduction in accordance with some embodiments.

FIG. 21 is a flow chart of a fabrication method 2100 according to some embodiments. Fabrication method 2100 describes the formation of a single-fin structure with a S/D height reduction according to some embodiments. Other fabrication operations may be performed between the various operations of method 2100 and may be omitted merely for clarity. This fabrication method is not limited to method 2100 and other alternative methods can be possible.

Operations 2110 and 2120 of fabrication method 2100 are the same as those described above with respect to 110 and 120 of fabrication method 100. In FIG. 5, where the structure is shown after operation 2120, insulating fins 500 have been formed adjacent to one or more of semiconductor fins 210. In some embodiments, the trench structures can be shorter than the height of the fins, and therefore insulating fins 500 may not be in physical contact with substrate 200.

Figure 22:
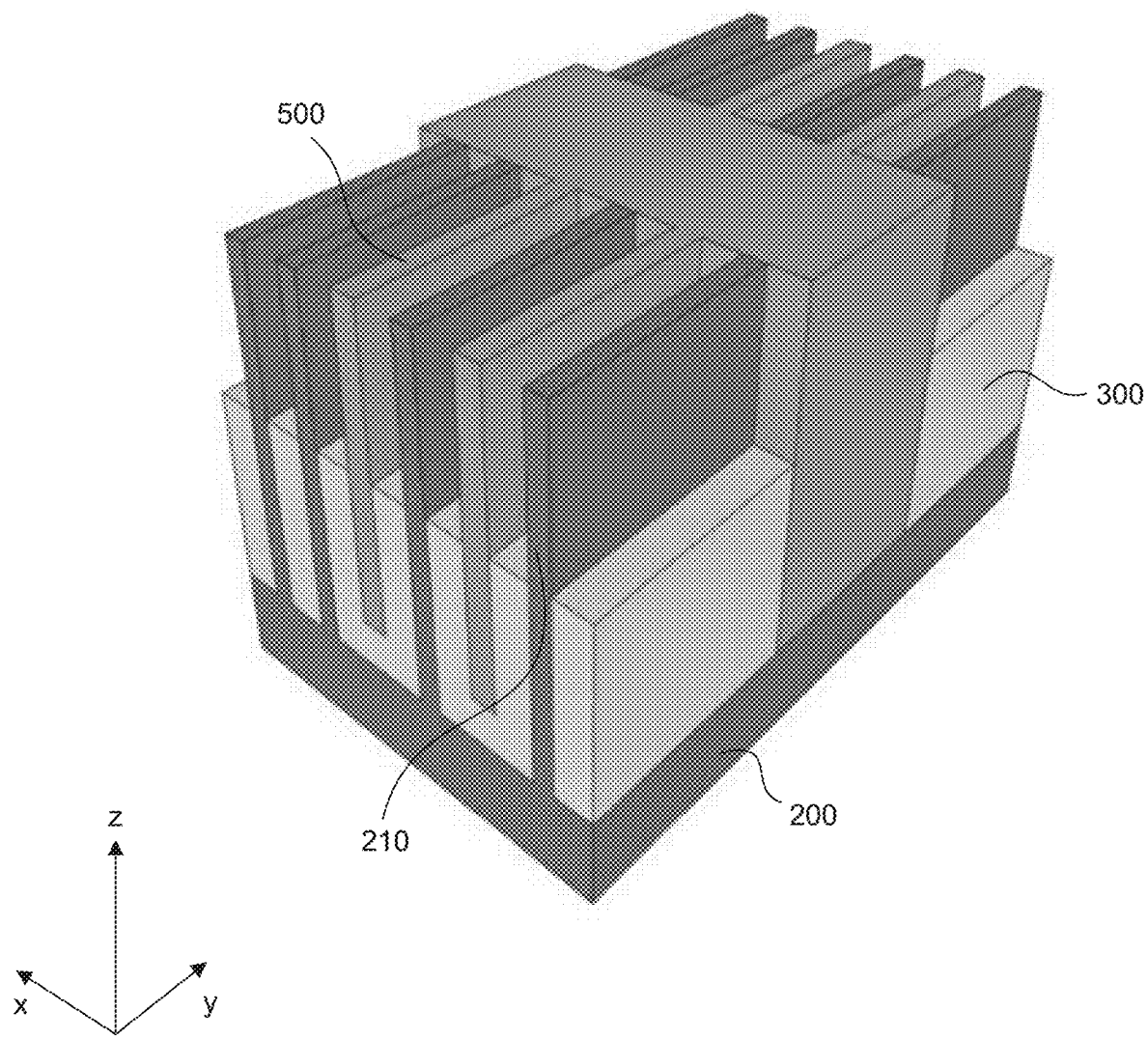
FIG. 22 is an isometric view of a semiconductor and insulating fin structure after an oxide layer recess process in accordance with some embodiments.
Figure 23:
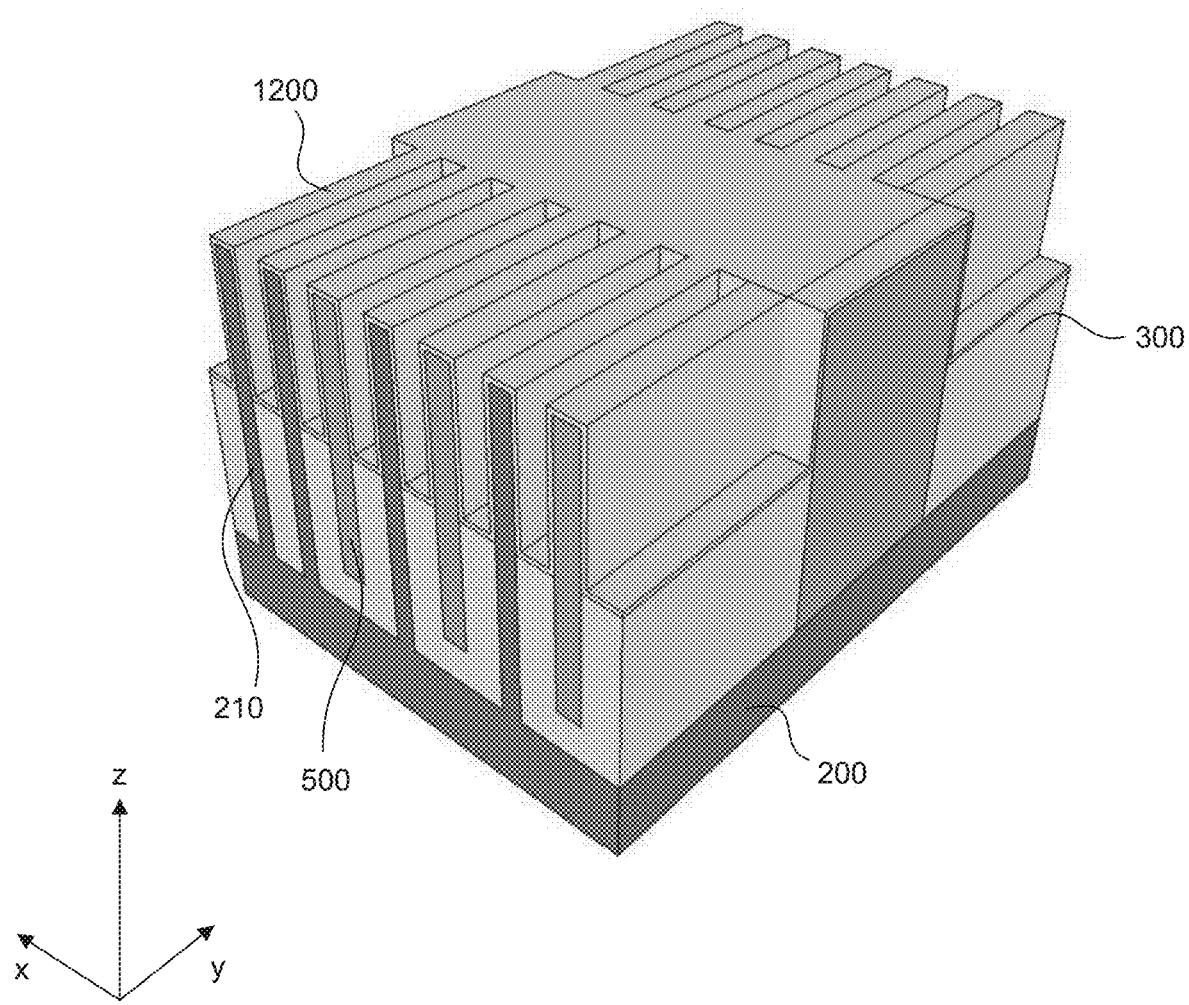
FIG. 23 is an isometric view of a semiconductor and insulating fin structure after an oxide layer deposition process in accordance with some embodiments.

Referring to FIG. 22, an etchback process can recess oxide layer 300 between semiconductor fins 210 and insulating fins 500 so that one or more of the fins can protrude above oxide layer 300. In some embodiments, hard mask layer 220 (shown if FIG. 5) can be removed with a selective etch process before an oxide layer 1200 can be deposited to cover the exposed surfaces (e.g., the top and sidewall surfaces) of semiconductor fins 210 and insulating fins 500, as shown in FIG. 23. In some embodiments, oxide layer 1200 is thinner than oxide layer 300, and its purpose is to protect semiconductor fins 210 and insulating fins 500 from subsequent processing operations. In some embodiments, oxide layer 1200 can be, for example, an $SiO_2$ layer. Alternatively, oxide layer 1200 can be an SiON or a FSG layer.

Figure 24:
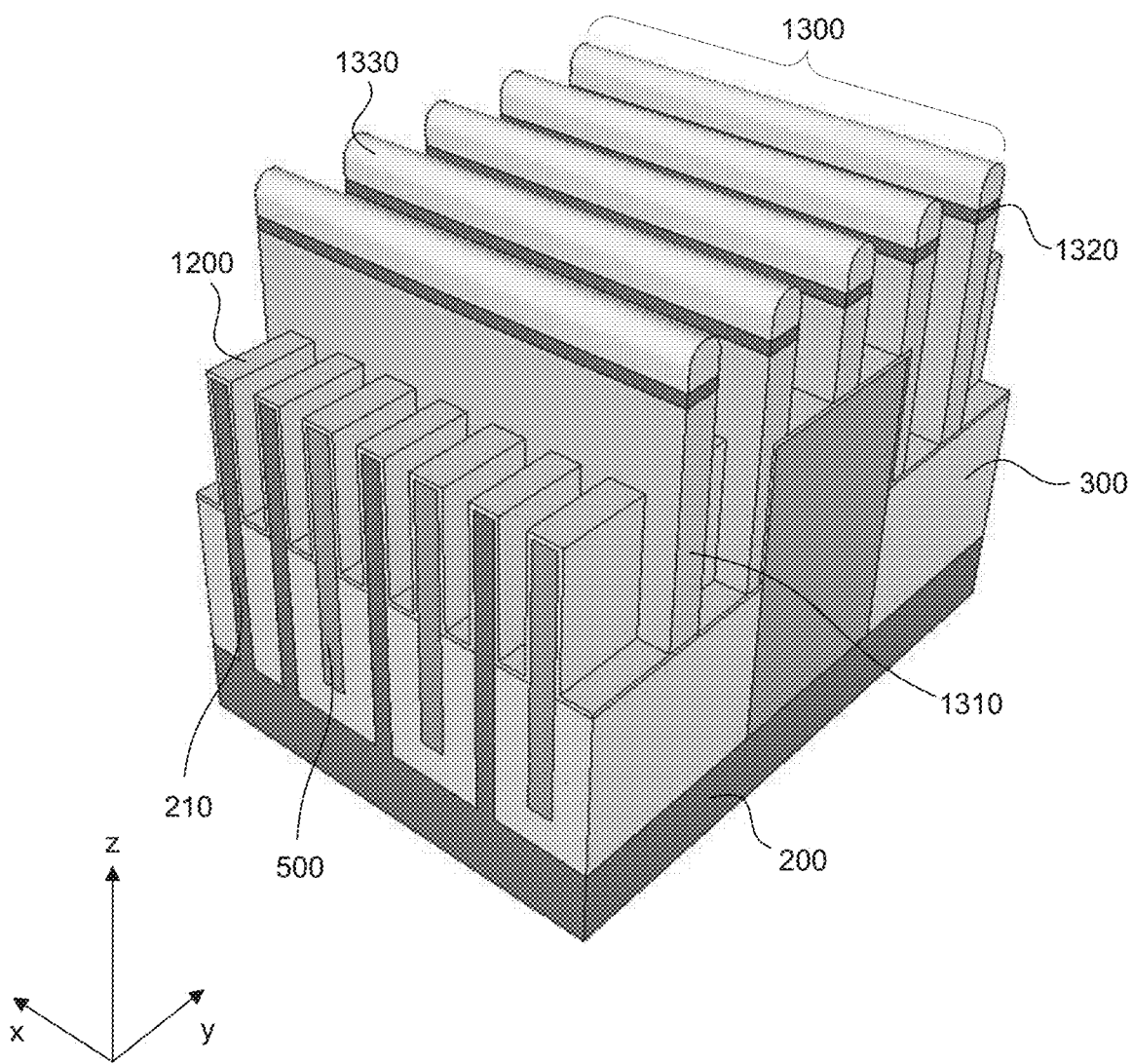
FIG. 24 is an isometric view of a semiconductor and insulating fin structure after a sacrificial gate structure formation in accordance with some embodiments.

In referring to FIG. 21, in operation 2130, sacrificial gate structures 1300 can be formed perpendicular to the direction of the fins (e.g., in the x-direction), as shown in FIG. 24. In some embodiments, gate structures 1300 can include a sacrificial gate electrode 1310, capping layer 1320, and oxide layer 1330. In some embodiments, sacrificial gate structures 1300 can be replaced with metal gates in subsequent operations. In some embodiments, sacrificial gate electrode 1310 can be, for example, polysilicon. By way of example and not limitation, sacrificial gate electrode 1310 can be deposited as a blanket polysilicon film that can be patterned with photolithography and etch operations.

Figure 25:
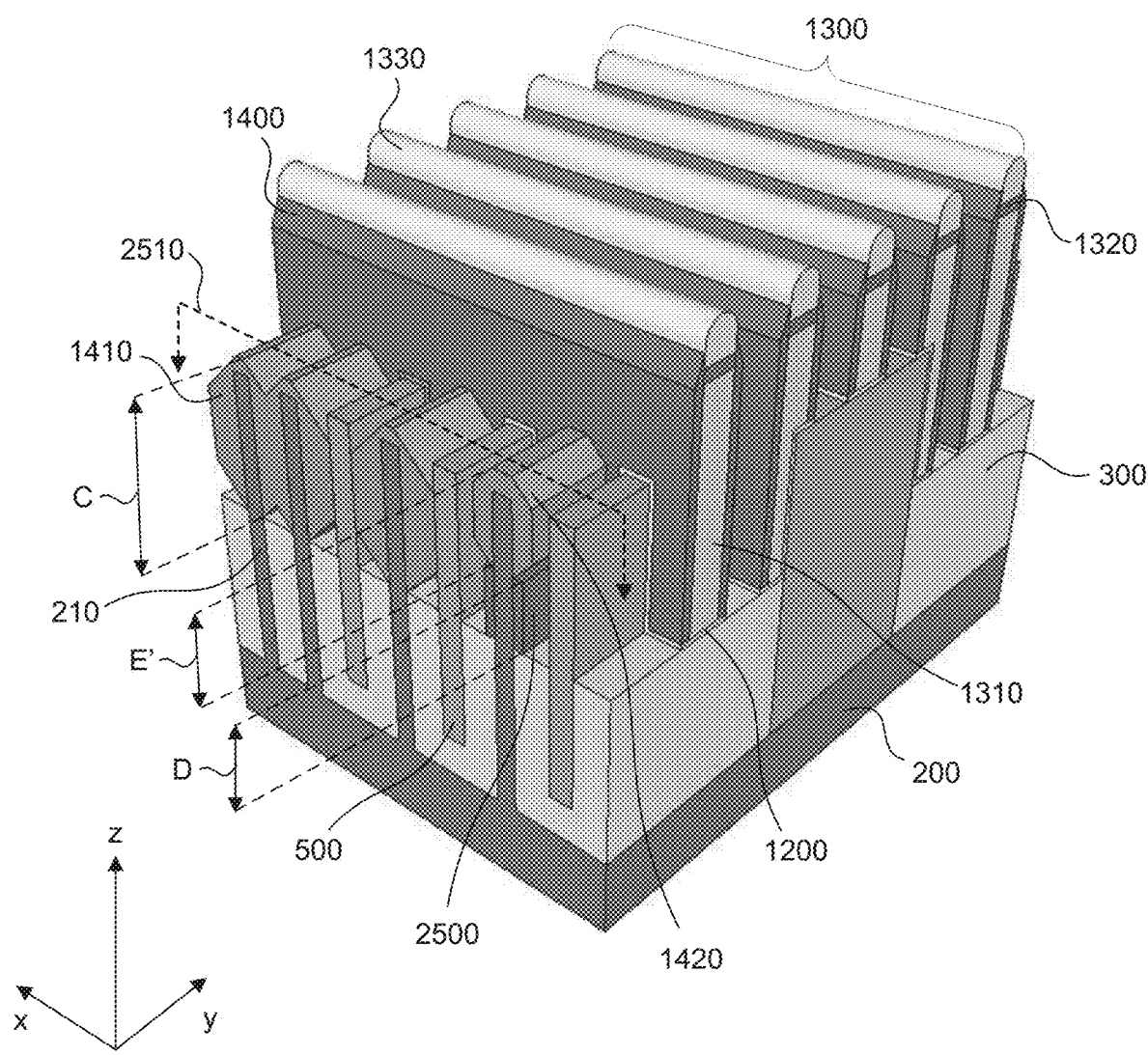
FIG. 25 is an isometric view of a semiconductor and insulating fin structure after a spacer and epitaxial stack formation in accordance with some embodiments.

In operation 2140 of fabrication method 2100, spacers 1400 are formed on the sidewalls of sacrificial gate structures 1300 as shown in FIG. 25. Spacers 1400 can function as alignment masks during an ion implantation operation for the formation of the source/drain regions in semiconductor fins 210. By way of example and not limitation, spacers material can be deposited as a blanket film that can be etched with an etchback process to form spacers 1400 on the sidewalls of sacrificial gate structures 1300. In some embodiments, the etchback process is anisotropic so that the spacer material is removed faster on horizontal surfaces (e.g., in the x- and y-direction) compared to vertical surfaces (e.g., in the z-direction). Since the spacer material is blanket deposited, it can cover the exposed surfaces including semiconductor fins 210 and insulating fins 500. A fin sidewall pull back process can remove the spacer material from the fins' sidewalls.

In some embodiments, spacers 1400 are grown selectively on exposed polysilicon material, such as sacrificial gate electrode 1310. In this case, an etchback process may not be necessary.

In some embodiments, spacers 1400 can be made of a dielectric material, such as $SiO_2$, SION, SiCN, $SiO_xC_y$, or SiN. In some embodiments, the thickness of spacers 1400 can range from about 2 nm to about 5 nm. Spacers 1400 can be a stack of one or more layers made of the same or different materials. According to some embodiments, spacers 1400 are not removed during the sacrificial gate stack removal process. According to some embodiments, spacers 1400 can serve as structural elements for a metal gate structure.

In some embodiments, another etchback process can remove oxide layer 1200, as shown in FIG. 25, from the exposed surfaces (e.g., the top and sidewall surfaces) of semiconductor fins 210 and insulating fins 500.

In some embodiments, a hard mask (not shown) can be deposited and patterned to leave a single fin exposed. A spacer can be deposited to form a spacer on the exposed fin, and a subsequent etchback process can be used to selectively remove the deposited spacer from a top portion of the exposed fin. In other words, the spacer can be recessed from the top of the exposed fin to form a recessed spacer 2500. The final height D of recessed spacer 2500 on the sidewalls of the exposed fin can be controlled with the etchback process. The hard mask, which is not shown, prevents the deposition of spacer material on fins or structures that are covered by the hard mask. With the aforementioned process, a recessed spacer 2500 with an adjustable final height D can be selectively grown on a single fin as shown in FIG. 25, according to some embodiments. By way of example and not limitation, recessed spacer 2500 can be made of a dielectric material, such as $SiO_2$, SION, SiCN, $SiO_xC_y$, or SiN. After the formation of recessed spacer 2500, the hard mask can be removed to expose the rest of the structures.

In referring to FIG. 25, in operation 2150, an epitaxial stack can be grown on each of the semiconductor fins. In some embodiments, epitaxial stack 1410 can be grown on semiconductor fins 210 and epitaxial stack 1420 can be grown on the single semiconductor fin with recessed spacer 2500. Since epitaxial stack 1420 is grown only on the surfaces of the fin that are not covered by recessed spacer 2500, the height E' of epitaxial stack 1420—measured from the top of recessed spacer 2500 to the tip of epitaxial stack 1420—can be controlled by final height D of recessed spacer 2500. According to some embodiments, epitaxial stack 1420 can be shorter than epitaxial stack 1410 due to the presence of recessed spacer 2500. In some embodiments, the height ratio E'/C between epitaxial stack 1420 and epitaxial stack 1410 can range from about 1:4 to about 2:3. As in the case of fabrication method 100, epitaxial stacks 1410 and 1420 can be either a p-type S/D or an n-type S/D. In some embodiments, recessed spacers 2500 can be grown on additional fins. Consequently, smaller epitaxial stacks 1420 with reduced height E' can be grown on more than one fin.

In some embodiments, the size of epitaxial stack 1420 can reduce a parasitic capacitance between the epitaxial stack 1420 and the metal gate structures. Further, the size of epitaxial stack 1420 may reduce the power consumption of the finFETs formed on the single fin with recessed spacers 2500.

For example purposes, and similar to fabrication method 100, epitaxial stacks 1410 and 1420 in method 2100 will be described in the context of B doped (p-type) SiGe epitaxial stacks. Based on the disclosure herein, n-type Si epitaxial stacks (e.g., P-doped, C-doped, etc.) can also be used. These materials are within the spirit and scope of this disclosure.

In some embodiments, insulating fins 500 can prevent physical and electrical contact between adjacent epitaxial stacks 1410 and 1420. In other words, insulating fins 500 can provide electrical insulation to neighboring epitaxial stacks 1410 and 1420. In some embodiments, insulating fins 500 can restrict the growth of epitaxial stacks 1410 and 1420 in the x-direction, and sacrificial gates 1300 can restrict the growth of epitaxial stacks 1410 and 1420 in the y-direction.

Figure 26:
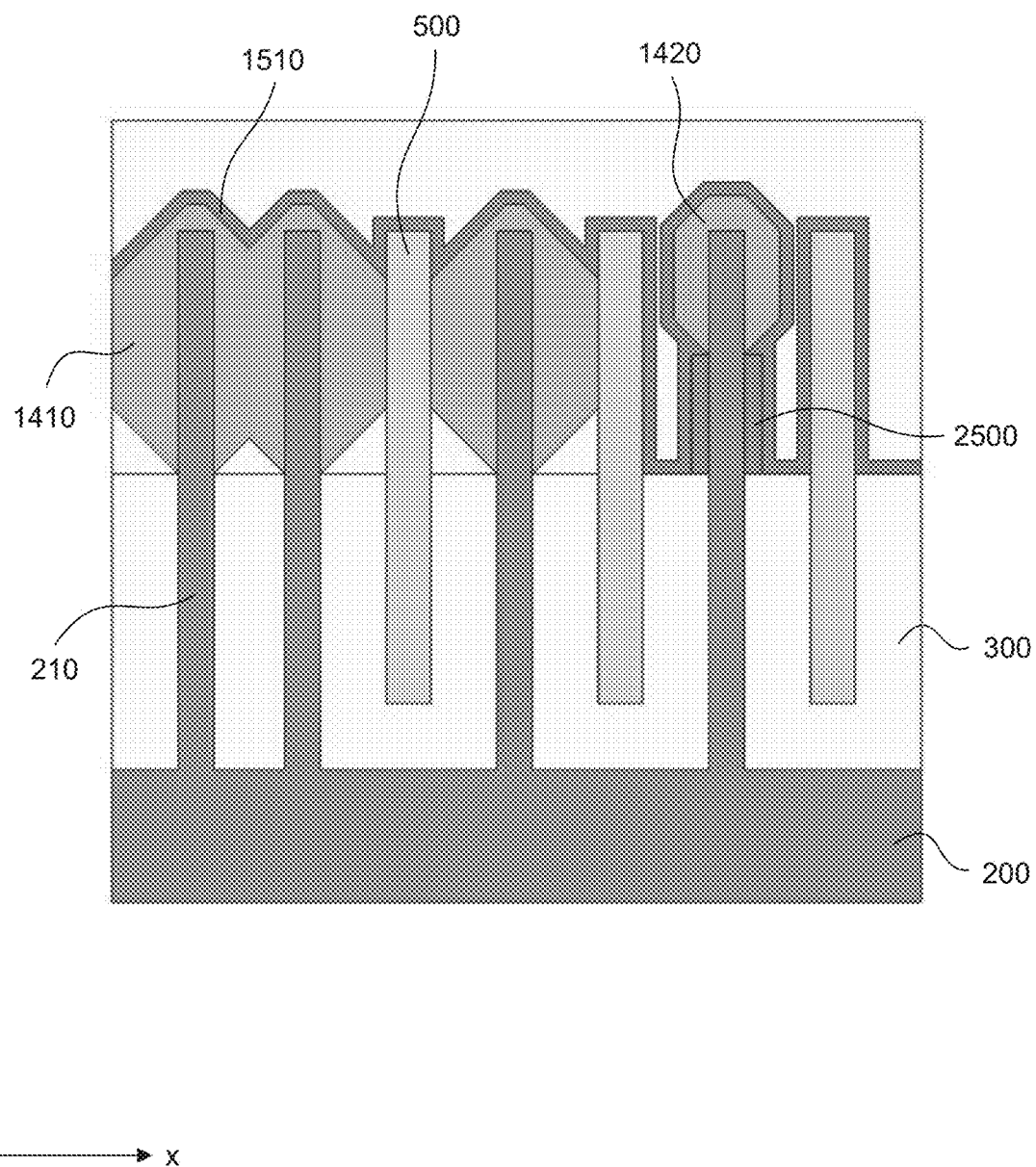
FIG. 26 is cross-sectional view of a semiconductor and insulating fin structure after a protective nitride layer deposition in accordance with some embodiments.

In some embodiments, after the epitaxial stack formation, a nitride layer can deposited over epitaxial stacks 1410 and 1420, semiconductor fins 210, and insulating fins 500. In some embodiments, the nitride layer can have a thickness range between about 3 nm to about 5 nm. In some embodiments, the nitride layer can be a SiN or a SiCN layer. Nitride layer 1510, as described above, is shown in FIG. 26 which is a cross-sectional view of FIG. 25 along line 2510.

In some embodiments, an ILD 2700 can be deposited over epitaxial stacks 1410 and 1420, semiconductor fins 210, and insulating fins 500. In some embodiments, the ILD layer can be deposited as a blanket film that can fill the space between sacrificial gate structures 1300 and extent over sacrificial gate structures 1300. In some embodiments, a CMP process can remove ILD material from the top of sacrificial gate structures 1300 so that the top surface of the ILD layer and the top surfaces of sacrificial gate structures 1300 are flushed (e.g., planar). According to some embodiments, FIG. 27 shows ILD 2700 after the operations described above.

Figure 27:
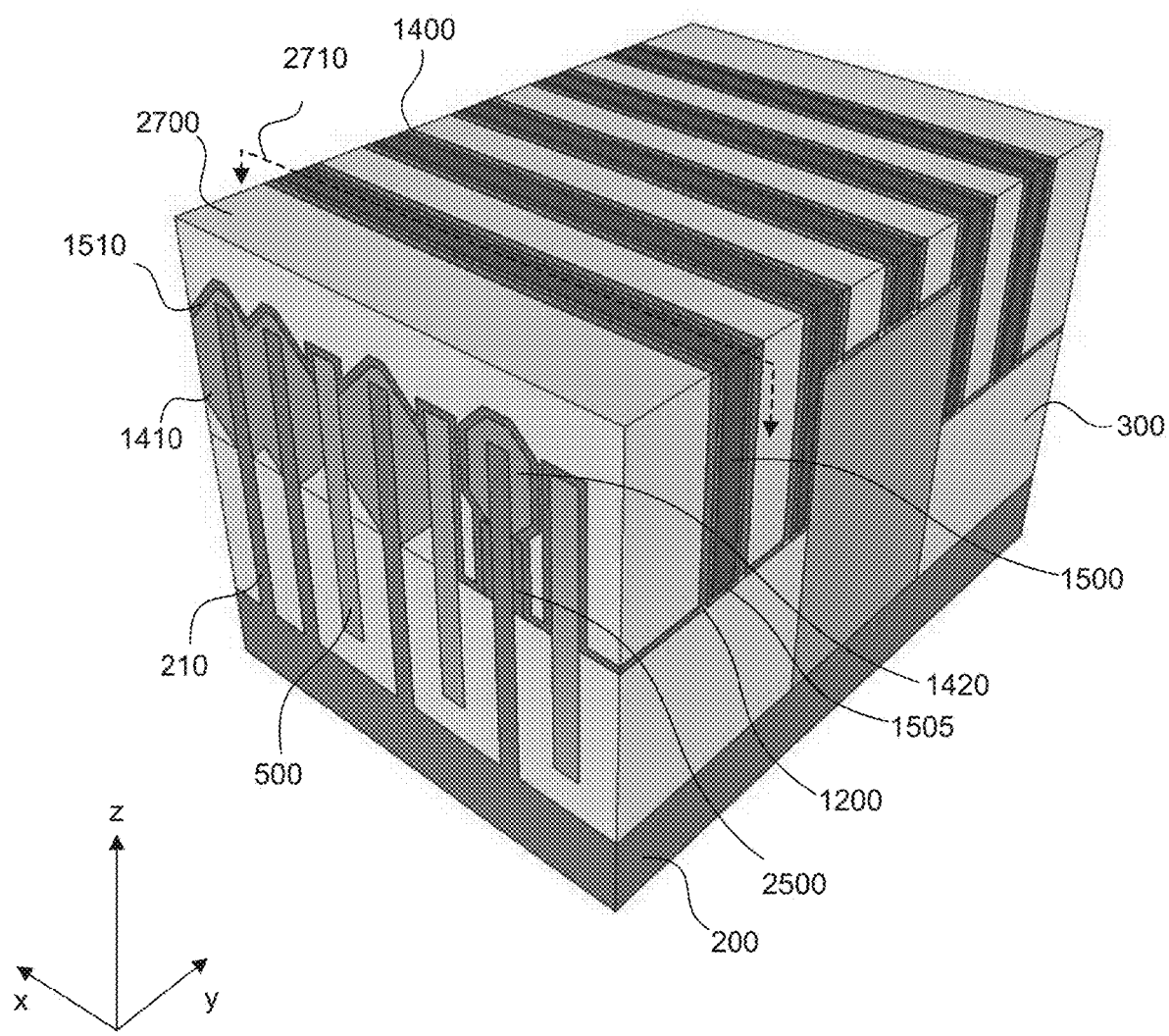
FIG. 27 is a cross-sectional view of a semiconductor and insulating fin structure after formation of an interlayer dielectric and a metal gate replacement process in accordance with some embodiments.

In referring to FIG. 27, in operation 2160, sacrificial gate structures 1300 can be replaced with metal gate structures. Further, in operation 2160, isolation regions can be formed in the metal gate structures according to some embodiments. In some embodiments, sacrificial gate structure 1300 can be removed with a wet etch process that is selective towards polysilicon material. The selectivity can be greater than about 1000:1 (e.g., 10000:1) so that spacers 1400 are not removed during the wet etch operation. In some embodiments, a metal gate structure is formed to replace the etched polysilicon material. By way of example and not limitation, the metal gate structure can include an IL, a high-k dielectric (e.g., with a k-value greater than 3.9) 1505, and one or more metal stacks. In FIG. 27, sacrificial gate structures 1300 (shown in FIG. 25) have been replaced with metal gate structures 1500. Nitride layer 1510 and ILD 2700—which are formed over epitaxial stacks 1410 and 1420, semiconductor fins 210, and insulating fins 500—are also shown. For illustration purposes, FIG. 27 includes select portions of a semiconductor structure and other portions (not shown) may be included. For example, the IL, and the one or more metal stacks of metal gate structures 1500 may be included.

In some embodiments, isolation regions can be formed in metal gate structures 1500 to "divide" metal gate structure 1500 into predetermined sections. By way of example and not limitation, the isolation regions in metal gate structures 1500 can be formed with photolithography and etch operations. For example, a photoresist layer can be coated over the top surfaces of ILD 2700 and metal gate structures 1500. The photoresist layer can be patterned such that openings are formed in the photoresist that expose portions of metal gate structures 1500. In some embodiments, the openings can be aligned to one or more of insulating fins 500. An etch process can etch the metal gate structure through the openings in the photoresist until a top surface of insulating fins 500 is exposed. A number of isolation trenches, which extend to insulating fins 500, can be formed in metal gate structures 1500. After the etch operation, the photoresist layer can be stripped, and a nitride layer can be deposited to fill the trenches in metal gate structures 1500 to form the isolation regions. In some embodiments, the isolation trenches can be filled with, for example, SiN.

Figure 28:
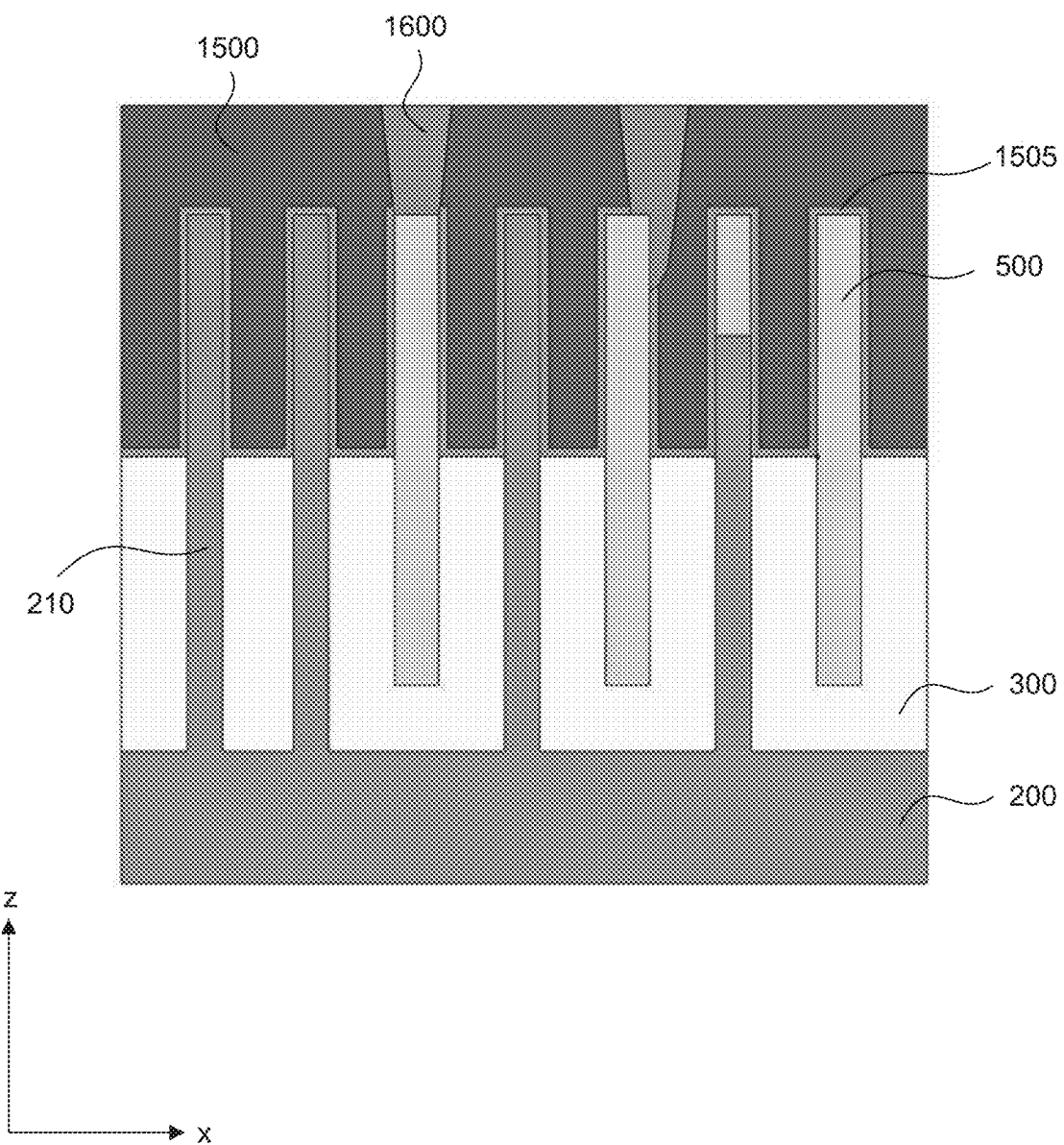
FIG. 28 is a cross-sectional view of a semiconductor and insulating fin structure after formation of isolation regions in a metal gate structure in accordance with some embodiments.

FIG. 28 is a cross-sectional view across line 2710 of FIG. 27 that shows the formed isolation regions 1600 in metal gate structures 1500 and on top of insulating fins 500. In some embodiments, isolation regions 1600 can reduce a parasitic capacitance between metal gate structure 1500 and semiconductor fins 210. In some embodiments, isolation regions 1600 can reduce a parasitic capacitance between metal gate structure 1500 and epitaxial stacks 1410 and 1420.

Figure 29:
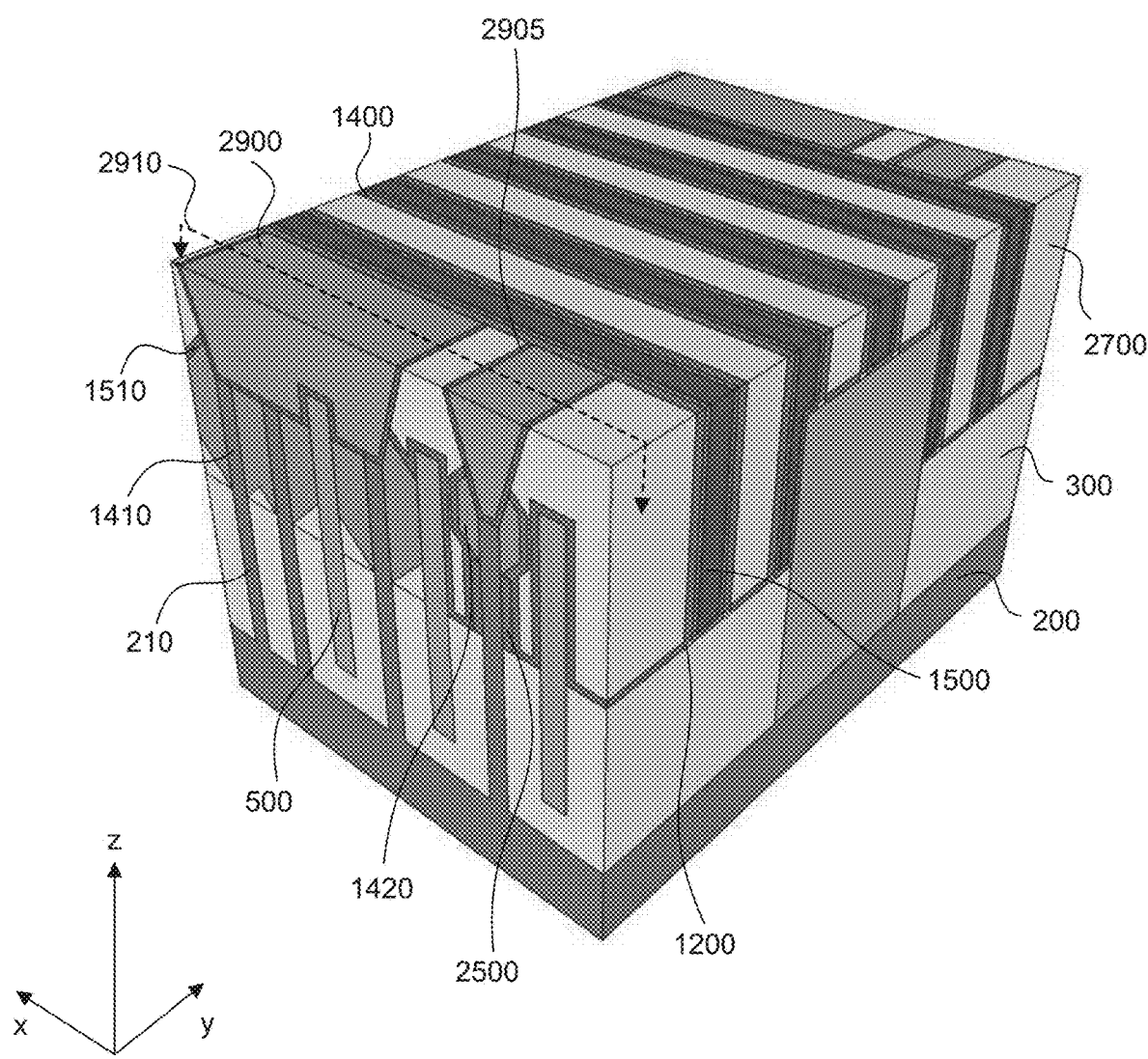
FIG. 29 is a cross-sectional view of a semiconductor and insulating fin structure after formation of metal contacts in accordance with some embodiments.
Figure 30:
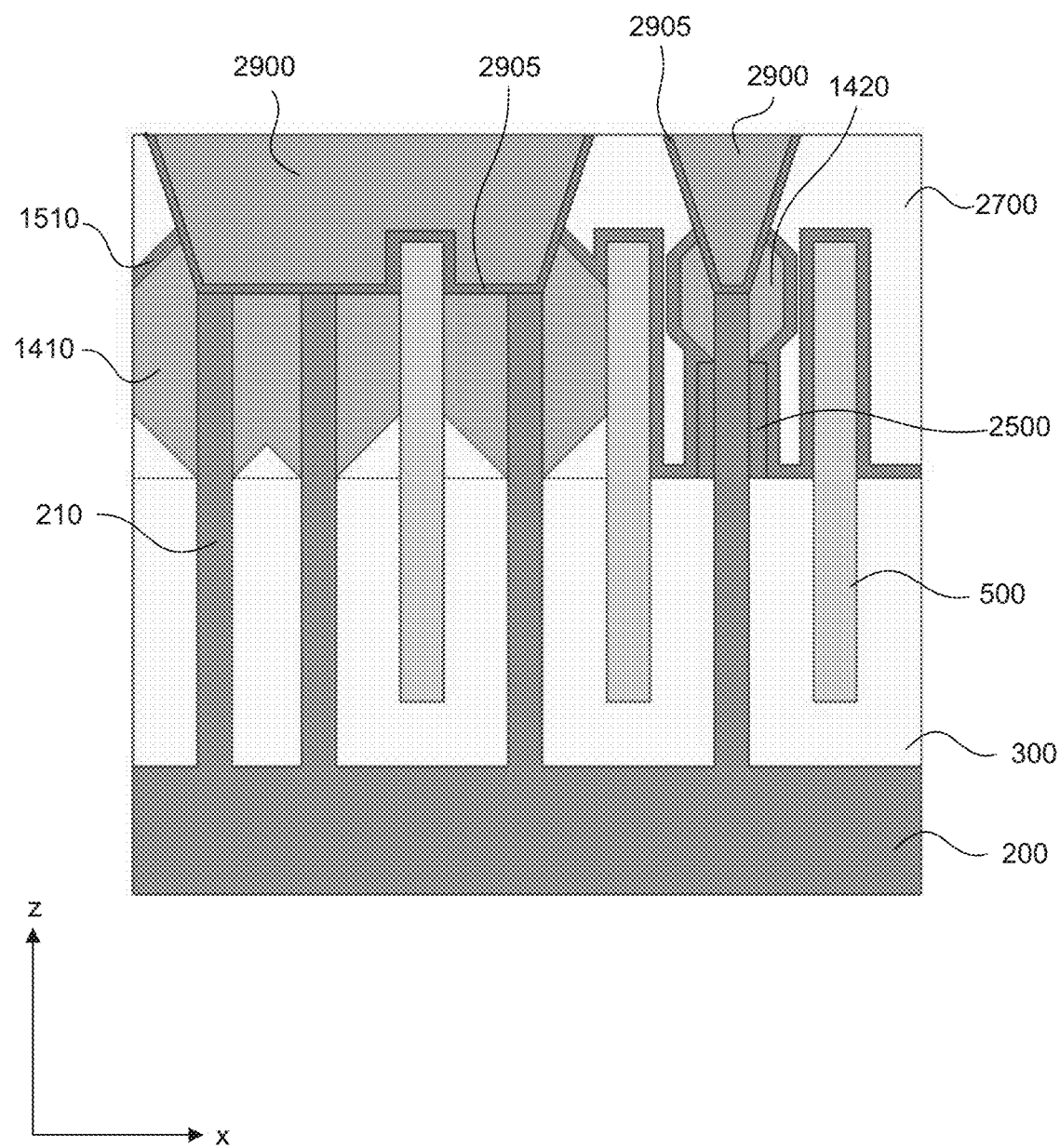
FIG. 30 is a cross-sectional view of a semiconductor and insulating fin structure after formation of metal contacts in accordance with some embodiments

Referring to FIG. 21, in operation 2170, metal contacts can be formed on epitaxial stacks 1410 and 1420 according to some embodiments. The metal contacts can be formed, for example, with photolithography and etch operations where a photoresist layer can be coated over ILD 2700 and metal gate structures 1500. The photoresist layer can be patterned such that openings can be formed in the photoresist layer that expose a portion of ILD 2700. In some embodiments, the openings can be aligned to epitaxial stacks 1410 and 1420. An etch process can etch ILD 2700 through the openings in the photoresist layer until a top surface of epitaxial stacks 1410 and 1420 is exposed. Therefore, a number of contact openings can be formed in ILD 2700 that extend to epitaxial stacks 1410 and 1420 according to some embodiments. The photoresist layer can be stripped, and a metal can be deposited to fill the contact openings in ILD 2700 to form the metal contacts. According to some embodiments, the metal fill can be, for example, Co. Alternatively, the metal fill can be W. FIG. 29 shows metal contacts 2900 on top of epitaxial stacks 1410 and 1420 according to some embodiments. In some embodiments, metal contacts 2900 have the same height. In some embodiments, a barrier layer 2905 is deposited before the metal can be deposited in metal contacts 2900. Barrier layer 2905 can be a stack of materials. For example, according to some embodiments, barrier layer 2905 can be a stack that includes a bottom Ti layer and a top TiN layer. By way of example and not limitation, barrier metal layer 2905 can have a thickness that can range from about 10 nm to about 14 nm. FIG. 30 is a cross-sectional view of FIG. 29 across line 2910.

The embodiments described herein are directed to embodiments that can reduce the power consumption of a fin structure. For example, in some embodiments, the fin height and the source/drain (S/D) height of the fin structure can be reduced from about 1:4 to about 2:3, thus reducing parasitic capacitances between, for example, a S/D region and a gate structure of a finFET. In some embodiments, the S/D height of the fin structure can be reduced without a fin height reduction.

In some embodiments, a structure includes a first semiconductor fin and a second semiconductor fin disposed on a substrate, where the second semiconductor fin has a height higher than that of the first semiconductor fin. The structure also includes (i) a first insulating fin disposed over the substrate and between the first and the second semiconductor fins, (ii) a second insulating fin disposed over the substrate and adjacent to the first semiconductor fin, where the first semiconductor fin is positioned between the first and the second insulating fins, (iii) a first epitaxial stack disposed on a portion of the first semiconductor fin. Further, the structure includes a second epitaxial stack on a portion of the second semiconductor fin having a height higher than that of the first epitaxial stack.

In some embodiments, a structure includes a first semiconductor fin and a second semiconductor fin disposed on a substrate. The structure also includes (i) a dielectric disposed over the substrate and surrounding a bottom portion of the first and second semiconductor fins, (ii) a spacer disposed on the dielectric and abutting a portion of a sidewall surface of the first semiconductor fin, (iii) a first insulating fin disposed over the substrate and between the first and the second semiconductor fins, (iv) a second insulating fin disposed over the substrate and adjacent to the first semiconductor fin, wherein the first semiconductor fin is positioned between the first the second insulating fins, (v) a first epitaxial stack on another portion of the first semiconductor fin. Further, the structure includes a second epitaxial stack on a portion of the second semiconductor fin, where the second epitaxial stack has a height higher than that of the first epitaxial stack.

In some embodiments, a method includes forming a first semiconductor fin and a second semiconductor fins on a substrate, where the second semiconductor fin has a height higher than that of the first semiconductor fin. The method also includes (i) forming a first insulating fin over the substrate and between the first and the second semiconductor fins, (ii) forming a second insulating fin over the substrate and adjacent to the first semiconductor fin, where the first semiconductor fin is positioned between the first and the second insulating fins, (iii) forming a third insulating fin over the substrate and adjacent to the second semiconductor fin, where the second semiconductor fin is positioned between the first and the third insulating fins, and (iv) forming a first epitaxial stack on a portion of the first semiconductor fin. Further, the method includes forming a second epitaxial stack on a portion of the second semiconductor fin, where the second epitaxial layer has a height higher than that of the first epitaxial stack.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:
1. A structure, comprising:
    a substrate;

a first semiconductor fin structure and a second semiconductor fin structure on the substrate, wherein the first and second semiconductor fin structures are spaced apart by a first dielectric layer;

a first insulating fin structure between the first and second semiconductor fin structures;

a second insulating fin structure adjacent to the first semiconductor fin structure, wherein the first semiconductor fin structure is between the first and second insulating fin structures;

a third insulating fin structure adjacent to the second semiconductor fin structure, wherein the second semiconductor fin structure is between the first and third insulating fin structures; and a second dielectric layer on top portions of the first semiconductor fin structure, the second semiconductor fin structure, the first insulating fin structure, the second insulating fin structure, and the third insulating fin structure.

2. The structure of claim 1, further comprising:

a first epitaxial stack on the first semiconductor fin structure; and a second epitaxial stack on the second semiconductor fin structure, wherein the second epitaxial stack is taller than the first epitaxial stack.

3. The structure of claim 2, wherein the second epitaxial stack is wider than the first epitaxial stack.

4. The structure of claim 2, wherein the second epitaxial stack is bounded by the first and third insulating fin structures.

5. The structure of claim 2, wherein a first distance between a top surface of the first epitaxial stack and a top surface of the first dielectric layer is greater than a second distance between a top surface of the second epitaxial stack and the top surface of the first dielectric layer.

6. The structure of claim 2, further comprising a spacer on a side surface of first semiconductor fin structure and under the first epitaxial stack.

7. The structure of claim 2, further comprising first and second contacts on the first and second epitaxial stacks, respectively.

8. The structure of claim 1, wherein the first, second, and third insulating fin structures comprise one or more of silicon oxy-carbon nitride (SiOCN), silicon oxy-carbide (SiOC), hafnium oxide (HfO$_2$), and zirconium oxide (ZrO$_2$).

9. A structure, comprising:

a substrate;

a first semiconductor fin structure and a second semiconductor fin structure on the substrate;

a first dielectric layer between the first and second semiconductor fin structures;

an epitaxial stack on the first semiconductor fin structure, wherein a distance between a bottom of the epitaxial stack and a top surface of the first dielectric layer is greater than zero;

an insulating fin structure having a lower portion embedded in the dielectric layer; and a second dielectric layer on the first and second semiconductor fin structures and in contact with a top surface of the insulating fin structure.

10. The structure of claim 9, wherein the second dielectric layer comprises a first portion on a side surface of the insulating fin structure and a second portion on a side surface of the epitaxial stack, and wherein a first side surface of the first portion opposes a second side surface of the second portion.

11. The structure of claim 9, further comprising a spacer on a side surface of the first semiconductor fin structure and in contact with the bottom of the epitaxial stack.

12. The structure of claim 11, wherein the second dielectric layer comprises a first portion on a side surface of the insulating fin structure and a second portion on a side surface of the spacer, and wherein a first side surface of the first portion opposes a second side surface of the second portion.

13. The structure of claim 9, further comprising an other epitaxial stack on the second semiconductor fin structure, wherein a bottom of the other epitaxial stack is in contact with a top surface of the first dielectric layer.

14. The structure of claim 13, wherein a first height of a side surface of the epitaxial stack is less than a second height of a side surface of the other epitaxial stack.

15. The structure of claim 13, wherein a first distance between a top surface of the epitaxial stack and a top surface of the first semiconductor fin structure is greater than a second distance between a top surface of the other epitaxial stack and a top surface of the second semiconductor fin structure.

16. A structure, comprising:

first and second semiconductor fin structures on a substrate;

a dielectric layer on the substrate and between the first and second semiconductor fin structures;

a spacer on the dielectric layer and abutting the first semiconductor fin structure;

a first epitaxial stack on the first semiconductor fin structure and the spacer;

a second epitaxial stack on the second semiconductor fin structure and the dielectric layer; and an insulating structure in contact with the second epitaxial stack.

17. The structure of claim 16, wherein a height of the second epitaxial stack is greater than a height of the first epitaxial stack, and wherein a width of the second epitaxial stack is greater than a width of the first epitaxial stack.

18. The structure of claim 16, further comprising an interlayer dielectric (ILD) between the first epitaxial stack and the insulating structure.

19. The structure of claim 18, further comprising another dielectric layer having a portion between the first epitaxial stack and the ILD.

20. The structure of claim 16, wherein the insulating structure comprises an insulating fin structure between the first and second semiconductor fin structures.

* * * * *